US012635444B2

(12) United States Patent
Choi et al.

(10) Patent No.: US 12,635,444 B2
(45) Date of Patent: May 19, 2026

(54) APPARATUS FOR TREATING SUBSTRATE AND METHOD FOR TREATING SUBSTRATE

(71) Applicant: SEMES CO., LTD., Cheonan-si (KR)

(72) Inventors: Yong Hyun Choi, Cheonan-si (KR); Young Hun Lee, Cheonan-si (KR); Yong Joon Im, Yongin-si (KR); Seung Hoon Oh, Cheonan-si (KR); Tae Jong Choi, Anyang-si (KR); Yong Sun Ko, Suwon-si (KR); Sang Min Lee, Seoul (KR); Jin Woo Jung, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 561 days.

(21) Appl. No.: 18/068,869

(22) Filed: Dec. 20, 2022

(65) Prior Publication Data

US 2023/0201883 A1     Jun. 29, 2023

(30) Foreign Application Priority Data

Dec. 24, 2021   (KR) ......................... 10-2021-0186949
Feb. 15, 2022   (KR) ......................... 10-2022-0019254

(51) Int. Cl.
*H10P 72/00*        (2026.01)
*B08B 13/00*        (2006.01)
(Continued)

(52) U.S. Cl.
CPC .......... *H10P 72/0406* (2026.01); *B08B 13/00* (2013.01); *H10P 72/0414* (2026.01);
(Continued)

(58) Field of Classification Search
CPC .......... H01L 21/6704; H01L 21/67028; H01L 21/67034; H01L 21/677; H10P 72/7602;
(Continued)

(56) References Cited

U.S. PATENT DOCUMENTS

2004/0067128 A1*   4/2004   Caveney ............. H01L 21/6835
                                                         414/783
2009/0032060 A1*   2/2009   Child .................. H01L 21/6838
                                                         134/32
(Continued)

FOREIGN PATENT DOCUMENTS

JP        2000-100766 A      4/2000
JP        2002-158205 A      5/2002
(Continued)

OTHER PUBLICATIONS

Machine translation of JP2002158205A, dated May 3, 2002. (Year: 2002).*

(Continued)

*Primary Examiner* — Michael E Barr
*Assistant Examiner* — Kevin G Lee
(74) *Attorney, Agent, or Firm* — HARNESS, DICKEY & PIERCE, P.L.C.

(57) ABSTRACT

Disclosed is an apparatus for treating a substrate. The apparatus for treating the substrate includes a liquid treating chamber for liquid-treating the substrate by supplying a treatment liquid to the substrate, a drying chamber for drying the substrate by supplying a process fluid to the substrate, a transfer unit for transferring the substrate between the liquid treating chamber and the drying chamber, and a rear surface cleaning unit for cleaning a rear surface of the substrate, in which the rear surface cleaning unit may clean the rear surface of the substrate while transferring the substrate from the liquid treating chamber to the drying chamber.

13 Claims, 17 Drawing Sheets

(51) Int. Cl.
  *H10P 72/76* (2026.01)
  *B25J 11/00* (2006.01)
  *H10P 72/30* (2026.01)
(52) U.S. Cl.
  CPC ...... *H10P 72/0456* (2026.01); *H10P 72/7602* (2026.01); *B25J 11/0095* (2013.01); *H10P 72/3302* (2026.01)
(58) Field of Classification Search
  CPC ............. H10P 72/0406; H10P 72/0414; H10P 72/0411
  See application file for complete search history.

(56) References Cited

U.S. PATENT DOCUMENTS

2016/0243593 A1* 8/2016 Tanaka ...................... B08B 1/36
2017/0345680 A1 11/2017 Lee et al.

FOREIGN PATENT DOCUMENTS

| | | | |
|---|---|---|---|
| JP | 2005-194613 A | 7/2005 | |
| JP | 2021-019205 A | 2/2021 | |
| KR | 100381316 B1 | 8/2003 | |
| KR | 20080061281 A * | 7/2008 | ........... H01L 21/683 |
| KR | 10-2011-0092035 A | 8/2011 | |
| KR | 10-2014-0084733 A | 7/2014 | |
| KR | 101571623 B1 | 11/2015 | |
| KR | 101736845 B1 | 5/2017 | |
| KR | 10-2021-0118871 A | 10/2021 | |
| TW | I503911 B | 10/2015 | |
| TW | 202121492 A | 6/2021 | |
| WO | WO-2016121704 A1 | 8/2016 | |

OTHER PUBLICATIONS

Japanese Office Action dated Aug. 27, 2024 issued in corresponding Japanese Appln. No. 2022-198858.
Japanese Office Action dated Feb. 27, 2024 issued in corresponding Japanese Appln. No. 2022-198858.
Korean Office Action dated Jul. 19, 2023 issued in corresponding Korean Patent Application No. 10-2022-0019254.
Taiwan Office Action dated Jul. 26, 2023 issued in corresponding Taiwan Patent Application No. 11220728980.

* cited by examiner

FIG. 12

APPARATUS FOR TREATING SUBSTRATE AND METHOD FOR TREATING SUBSTRATE

CROSS-REFERENCE TO RELATED APPLICATIONS

This application claims priority to and the benefit of the Korean Patent Application Nos. 10-2021-0186949 and 10-2022-0019254 filed in the Korean Intellectual Property Office on Dec. 24, 2021 and Feb. 15, 2022, the entire contents of which are incorporated herein by reference.

TECHNICAL FIELD

The present invention relates to an apparatus for treating a substrate, and more particularly, to a substrate treating apparatus and a substrate treating method for liquid-treating a substrate by supplying a liquid to the substrate.

BACKGROUND ART

In general, in order to manufacture a semiconductor device, various processes such as a photo process, an etching process, an ion implantation process, and a deposition process are performed.

While performing each process, various foreign substances such as particles, organic contaminants, and metal impurities are generated. The generated foreign substances cause defects in a substrate and act as a factor that directly affects the performance and yield of semiconductor devices. Accordingly, a cleaning process for removing foreign substances remaining on the substrate is performed before and after manufacturing processes of the semiconductor device are performed.

The cleaning process includes removing foreign substances remaining on the substrate using a chemical, removing the chemical remaining on the substrate using a cleaning liquid such as deionized water (DIW), removing the cleaning liquid remaining on the substrate using an organic solvent having a lower surface tension than the cleaning liquid, and drying the organic solvent remaining on the surface of the substrate.

Various liquids used in the process of performing the cleaning process have fluidity. Thus, there is a problem in that the liquid supplied to the substrate is separated from the substrate while the substrate is transferred to perform the drying step. Also, when an excessive amount of liquid is supplied onto the substrate to remove particles remaining on the substrate, the liquid supplied to the substrate is separated from the substrate. The liquid separated from the substrate remains in a chamber in which the transfer process of the substrate or a subsequent process is performed to serve as a contaminant contaminating a subsequent substrate.

SUMMARY OF THE INVENTION

The present invention has been made in an effort to provide a substrate treating apparatus and a substrate treating method capable of efficiently cleaning the substrate.

The present invention has also been made in an effort to provide a substrate treating apparatus and a substrate treating method capable of efficiently removing a liquid remaining on a rear surface of the substrate.

The present invention has also been made in an effort to provide a substrate treating apparatus and a substrate treating method capable of efficiently removing a liquid remaining on a rear surface of the substrate while transferring the substrate.

Other objects of the present invention are not limited thereto, and other objects, which are not mentioned above, will be apparent to those skilled in the art from the following description.

An exemplary embodiment of the present invention provides an apparatus for treating a substrate. The apparatus for treating the substrate includes a liquid treating chamber for liquid-treating the substrate by supplying a treatment liquid to the substrate, a drying chamber for drying the substrate by supplying a process fluid to the substrate, a transfer unit for transferring the substrate between the liquid treating chamber and the drying chamber, and a rear surface cleaning unit for cleaning a rear surface of the substrate, in which the rear surface cleaning unit may clean the rear surface of the substrate while transferring the substrate from the liquid treating chamber to the drying chamber.

According to an exemplary embodiment, the transfer unit may include a transfer robot that moves inside a transfer frame for providing a transfer space and has a transfer hand on which the substrate is seated.

According to an exemplary embodiment, the rear surface cleaning unit may include a contact member that comes into contact with the rear surface of the substrate to remove the treatment liquid remaining on the rear surface of the substrate.

According to an exemplary embodiment, the contact member may be provided on the transfer robot.

According to an exemplary embodiment, the contact member may be located below the hand and come into contact with the rear surface of the substrate by vertical movement of the hand on which the substrate is placed.

According to an exemplary embodiment, a plurality of holes penetrating through upper and lower ends of the contact member may be formed in the contact member, and the holes may be spaced apart from each other along the longitudinal direction of the contact member.

According to an exemplary embodiment, a rear surface cleaning frame having a slot on which the substrate is seated may be provided inside the transfer frame, the rear surface cleaning frame may be located between the liquid treating chamber and the transfer frame, and the contact member may be provided inside the rear surface cleaning frame.

According to an exemplary embodiment, the contact member may be provided at a position in contact with the rear surface of the substrate in the process of transferring the substrate seated on the hand into the rear surface cleaning frame.

According to an exemplary embodiment, the rear surface cleaning unit may include a non-contact member that is spaced apart from the rear surface of the substrate to remove the treatment liquid remaining on the rear surface of the substrate in a non-contact manner.

According to an exemplary embodiment, the non-contact member may supply a decontamination source for removing the treatment liquid toward the rear surface of the substrate, and the decontamination source may be provided by heat or airflow.

According to an exemplary embodiment, the non-contact member may be provided on the transfer robot.

According to an exemplary embodiment, a rear surface cleaning frame having slots on which the substrate is seated may be provided inside the transfer frame, the rear surface cleaning frame may be located between the liquid treating chamber and the transfer frame, and the non-contact member may be provided inside the rear surface cleaning frame.

According to an exemplary embodiment, the drying chamber may include a support for supporting the substrate, and the support may support an edge region of the rear surface of the substrate which has been liquid-treated.

Another embodiment of the present invention provides a method for treating a substrate. The method for treating the substrate may include a liquid treating step of supplying a treatment liquid to the substrate, a transferring step of transferring the liquid-treated substrate, and a drying step of drying the substrate by supplying a process fluid to the liquid-treated substrate, in which in the transferring step, the treatment liquid remaining on the rear surface of the substrate may be removed while the liquid-treated substrate is transferred.

According to an exemplary embodiment, in the transferring step, the treatment liquid remaining on the rear surface of the substrate may be removed by mutual contact between the liquid-treated substrate and a contact member in contact with the rear surface of the substrate.

According to an exemplary embodiment, the transferring step may be performed by a transfer robot for transferring the liquid-treated substrate, and the contact member may be provided on the transfer robot to be in contact with the rear surface of the substrate while the transfer robot transfers the liquid-treated substrate.

According to an exemplary embodiment, the contact member may be provided in a rear surface cleaning frame provided in a transfer space for transferring the liquid-treated substrate in the transferring step, and the transferring step may include a first transferring step of transferring the substrate which has been liquid-treated from the liquid treating chamber where the liquid treating step is performed to the rear surface cleaning frame, a rear surface cleaning step of cleaning the rear surface of the substrate in the rear surface cleaning frame, and a second transferring step of transferring the substrate to a drying chamber in which the drying step is performed after the rear surface cleaning step.

According to an exemplary embodiment, in the transferring step, the treatment liquid remaining on the rear surface of the liquid-treated substrate may be removed from the substrate in a non-contact manner by a non-contact member for supplying a decontamination source for removing the treatment liquid toward the rear surface of the substrate.

According to an exemplary embodiment, the non-contact member may be provided in a transfer robot for transferring the liquid-treated substrate in the transferring step and/or a rear surface cleaning frame provided in a transfer space for transferring the liquid-treated substrate in the transferring step.

Yet another embodiment of the present invention provides an apparatus for treating a substrate. The apparatus of treating the substrate may include a liquid treating chamber for liquid-treating a substrate by supplying a treatment liquid to an upper surface of the substrate, a drying chamber for drying the substrate by supplying a supercritical fluid to the substrate, a transfer unit for transferring the substrate between the liquid treating chamber and the drying chamber, and a rear surface cleaning unit for cleaning the rear surface of the substrate, in which the drying chamber may include a housing having an inner space and a support unit for supporting an edge region of the rear surface of the substrate which has been liquid-treated in the inner space, and the rear surface cleaning unit may remove the treatment liquid remaining on the rear surface of the substrate by cleaning the rear surface of the substrate in a contact method and/or a non-contact method while the substrate is transferred from the liquid treating chamber to the drying chamber.

According to the exemplary embodiment of the present invention, it is possible to efficiently clean the substrate.

Further, according to the exemplary embodiment of the present invention, it is possible to efficiently remove a liquid remaining on a rear surface of the substrate.

Further, according to the exemplary embodiment of the present invention, it is possible to efficiently remove a liquid remaining on a rear surface of the substrate while transferring the substrate.

The effect of the present invention is not limited to the foregoing effects, and non-mentioned effects will be clearly understood by those skilled in the art from the present specification and the accompanying drawings.

BRIEF DESCRIPTION OF THE DRAWINGS

FIGS. 12 to 13 are diagrams sequentially illustrating a state in which the substrate is dried in a drying step according to the exemplary embodiment of FIG. 8.

DETAILED DESCRIPTION

Figure 1:
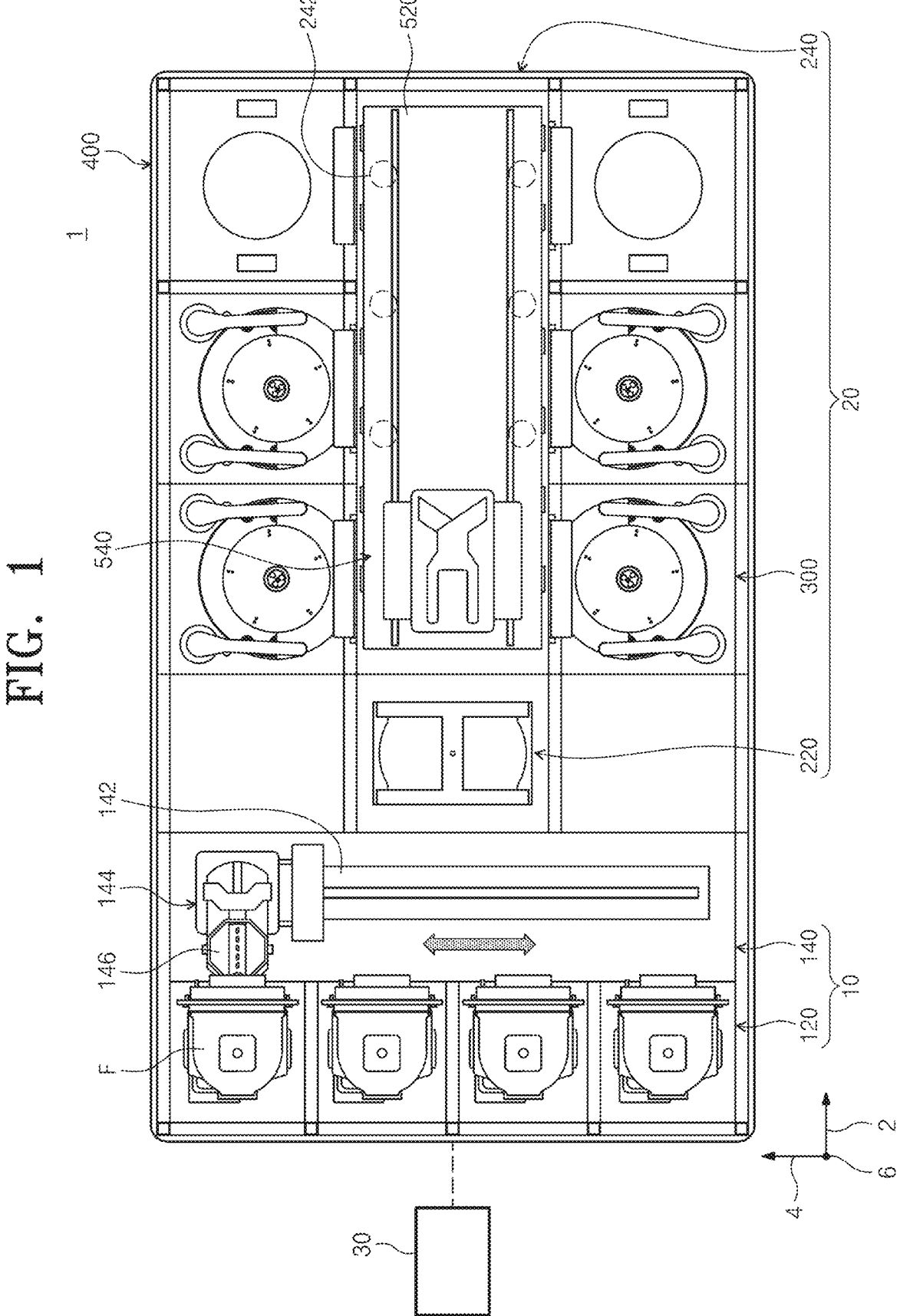
FIG. 1 is a diagram schematically illustrating an exemplary embodiment of a substrate treating apparatus of the present invention.

Hereinafter, exemplary embodiments of the present invention will be described in more detail with reference to the accompanying drawings. Exemplary embodiments of the present invention may be modified in various forms and should not be construed that the scope of the present invention is limited to exemplary embodiments to be described below. The exemplary embodiments will be provided for more completely explaining the present invention to those skilled in the art. Therefore, shapes, and the like of components in the drawings are exaggerated to emphasize a more clear description.

Terms, such as first and second, are used for describing various constituent elements, but the constituent elements are not limited by the terms. The terms are used only for distinguishing one component from the other component. For example, without departing from the scope of the invention, a first constituent element may be named as a second constituent element, and similarly a second constituent element may be named as a first constituent element.

In the exemplary embodiment, a process of liquid-treating a substrate W by supplying a liquid such as a cleaning liquid onto the substrate W will be described as an example. However, the present embodiment is not limited to a cleaning process, but may be applied to various processes for treating the substrate W using a liquid, such as an etching process, an ashing process, or a developing process.

Hereinafter, an exemplary embodiment of the present invention will be described in detail with reference to FIGS. 1 to 20. A substrate treating apparatus 1 according to an exemplary embodiment of the present invention may perform a cleaning process including a drying process of drying the substrate W using a process fluid.

FIG. 1 is a plan view schematically illustrating a substrate treating apparatus according to an exemplary embodiment of the present invention. Referring to FIG. 1, the substrate treating apparatus 1 includes an index module 10 and a treating module 20. According to an exemplary embodiment, the index module 10 and the treating module 20 are disposed along one direction. Hereinafter, the direction in which the index module 10 and the treating module 20 are disposed is defined as a first direction 2. When viewed from the top, a direction vertical to the first direction 2 is referred to as a second direction 4, and a direction vertical to a plane including both the first direction 2 and the second direction 4 is referred to as a third direction 6.

The index module 10 transfers the substrate W to the treating module 20 for treating the substrate W from a container F in which the substrate W is accommodated. The index module 10 accommodates the substrate W that has been treated in the treating module 20 into the container F. The longitudinal direction of the index module 10 is provided as the second direction 4. The index module 10 has a load port 120 and an index frame 140.

The container F in which the substrate W is accommodated is seated on the load port 120. The load port 120 is located on an opposite side of the treating module 20 based on the index frame 140. A plurality of load ports 120 may be provided. The plurality of load ports 120 may be disposed in a line along the second direction 4. The number of load ports 120 may increase or decrease according to process efficiency and footprint conditions of the treating module 20.

A plurality of slots (not illustrated) is formed in the container F. The slots (not illustrated) may accommodate the substrates W while being horizontally disposed on the ground. As the container F, a sealed container such as a front opening unified pod (FOUP) may be used. The container F may be placed on the load port 120 by a transfer means (not illustrated), such as an overhead transfer, an overhead conveyor, or an automatic guided vehicle, or by an operator.

An index rail 142 and an index robot 144 are provided inside the index frame 140. The index rail 142 is provided in the index frame 140 along the second direction 4 as its longitudinal direction. The index robot 144 may transfer the substrate W. The index robot 144 may transfer the substrate W between the index port 10 and a buffer unit 220 to be described below.

The index robot 144 may include an index hand 146. The substrate W may be seated on the index hand 146. The index hand 146 may be provided to be movable along the second direction 4 on the index rail 142. Accordingly, the index hand 146 can move forward and backward along the index rail 142. In addition, the index hand 146 may be provided to be rotatable in the third direction 6 as an axis. In addition, the index hand 146 may be provided to be vertically movable in the third direction 6. A plurality of index hands 146 may be provided. The plurality of index hands 146 may be spaced apart from each other in a vertical direction. The plurality of index hands 146 may independently move forward, backward, and rotate.

A controller 30 may control the substrate treating apparatus 1. The controller 30 may include a process controller consisting of a microprocessor (computer) executing a control of the substrate treating apparatus 1, a user interface consisting of a keyboard for performing a command input operation and the like to manage the substrate treating apparatus 1 by an operator or a display and the like for visualizing and displaying an moving situation of the substrate treating apparatus 1, and a memory unit stored with control programs for executing treatment performed in the substrate treating apparatus 1 under control of a process controller or programs, that is, treatment recipes for executing the treatment in each configuration unit according to various data and treatment conditions. In addition, the user interface and the memory unit may be connected to the process controller. The treatment recipes may be stored in a storage medium in the memory unit, and the storage medium may be a hard disk, and may also be a transportable disk such as a CD-ROM and a DVD, or a semiconductor memory such as a flash memory.

The controller 30 may control the substrate treating apparatus 1 to perform a substrate treating method to be described below. For example, the controller 30 may perform a substrate treating method to be described below by controlling components provided to a transfer unit 500 and a rear surface cleaning unit 600 to be described below.

The treating module 20 includes a buffer unit 220, a transfer frame 240, a liquid treating chamber 300, a drying chamber 400, a transfer unit 500, and a rear surface cleaning unit 600. The buffer unit 220 provides a buffer space where the substrate W carried into the treating module 20 and the substrate W carried out from the treating module 20 temporarily stay. The transfer frame 240 provides a transfer space for transferring the substrate W between the buffer unit 220, the liquid treating chamber 300, and the drying chamber 400. In addition, the buffer frame 240 provides a rear surface cleaning space for cleaning a rear surface of the substrate W while the substrate W which has been liquid-treated in the liquid treating chamber 300 is transferred from the liquid treating chamber 300 to the drying chamber 400.

The liquid treating chamber 300 and the drying chamber 400 may perform a cleaning process. The cleaning process may be sequentially performed in the liquid treating chamber 300 and the drying chamber 400. The liquid treating chamber 300 performs a liquid treating process of liquid-treating the substrate W by supplying a liquid onto the substrate W. In the liquid treating chamber 300, a treatment liquid may be supplied onto the substrate W. For example, the treatment liquid may be at least one of a chemical, a rinsing liquid, and an organic solvent. The drying chamber 400 may perform a drying process of drying the liquid remaining on the substrate W. For example, the drying chamber 400 may perform a drying process of drying the liquid remaining on the substrate W using a supercritical fluid.

The buffer unit 220 may be disposed between the index module 140 and the transfer frame 240. The buffer unit 220 may be positioned at one end of the transfer frame 240. Slots (not illustrated) on which the substrate W is placed are provided inside the buffer unit 220. A plurality of slots (not illustrated) is provided. The plurality of slots (not illustrated) is provided to be spaced apart from each other along the third direction 6. The buffer unit 220 has opened front face and rear face. The front face may be a face facing the index module 10, and the rear face may be a face facing the transfer frame 240. The index robot 144 approaches the buffer unit 220 through the front face, and the transfer robot 540 may approach the buffer unit 220 through the rear face.

The transfer frame 240 has a transfer space in which the substrate W is transferred. The transfer frame 240 may have a transfer space for transferring the substrate W between the buffer unit 220, the liquid treating chamber 300, and the drying chamber 400 therein. Configurations of the transfer unit 500 to be described below may be disposed in the transfer space. For example, a guide rail 520 and a transfer robot 540 to be described below may be disposed in the transfer space.

A fan filter unit (not illustrated) may be provided on an upper surface of the transfer space of the transfer frame 240 to form a descending airflow into the transfer space. The fan filter unit (not illustrated) may include a fan and a filter. The fan filter unit (not illustrated) supplies external air to the transfer space. The filter removes impurities contained in the air.

An exhaust member 242 may be provided on a lower surface of the transfer space of the transfer frame 240. A plurality of exhaust members 242 may be provided. The exhaust member 242 may form a negative pressure in the transfer space. The exhaust member 242 may discharge various particles and by-products generated in the transfer space to the outside of the transfer space. Thus, the particles and the like existing in the transfer space may be discharged to the outside of the transfer space through the exhaust member 242 along with the descending airflow of the transfer space formed by the fan filter unit (not illustrated).

The longitudinal direction of the transfer frame 240 may be provided in the first direction 2. The liquid treating chamber 300 and the drying chamber 400 may be disposed on both sides of the transfer frame 240. The liquid treating chamber 300 and the drying chamber 400 may be disposed on the side portion of the transfer frame 240. The transfer frame 240 and the liquid treating chamber 300 may be disposed along the second direction 4. In addition, the transfer frame 240 and the drying chamber 400 may be disposed along the second direction 4.

According to one example, the liquid treating chambers 300 are disposed on both sides of the transfer frame 240, and the drying chambers 400 are disposed on both sides of the transfer frame 240. The liquid treating chambers 300 may be disposed relatively closer to the buffer unit 220 than the drying chambers 400. The liquid treating chambers 240 may be provided in an array of A×B (A and B are natural numbers of 1 or greater than 1, respectively) along the first direction 2 and the third direction 6 on one side of the transfer frame 240, respectively. Here, A represents the number of liquid treating chambers 300 provided along the first direction 2 in a line, and B represents the number of liquid treating chambers 300 provided along the third direction 6 in a line. For example, when four liquid treating chambers 300 are provided on one side of the transfer frame 240, the liquid treating chambers 300 may be disposed in an array of 2×2. The number of liquid treating chambers 300 may increase or decrease. Unlike the above, the liquid treating chamber 300 may be provided only on one side of the transfer frame 240, and only the drying chambers 400 may be disposed on the other side facing the one side. In addition, the liquid treating chamber 300 and the drying chamber 400 may be provided in a single layer on one side and both sides of the transfer frame 240.

The liquid treating chamber 300 performs a liquid treating process on the substrate W. For example, the liquid treating chamber 300 may be a chamber that performs a cleaning process for removing process by-products attached to the substrate W. The liquid treating chamber 300 may have a different structure according to a type of process for treating the substrate W. Unlike this, each of the liquid treating chambers 300 may have the same structure as each other.

Figure 2:
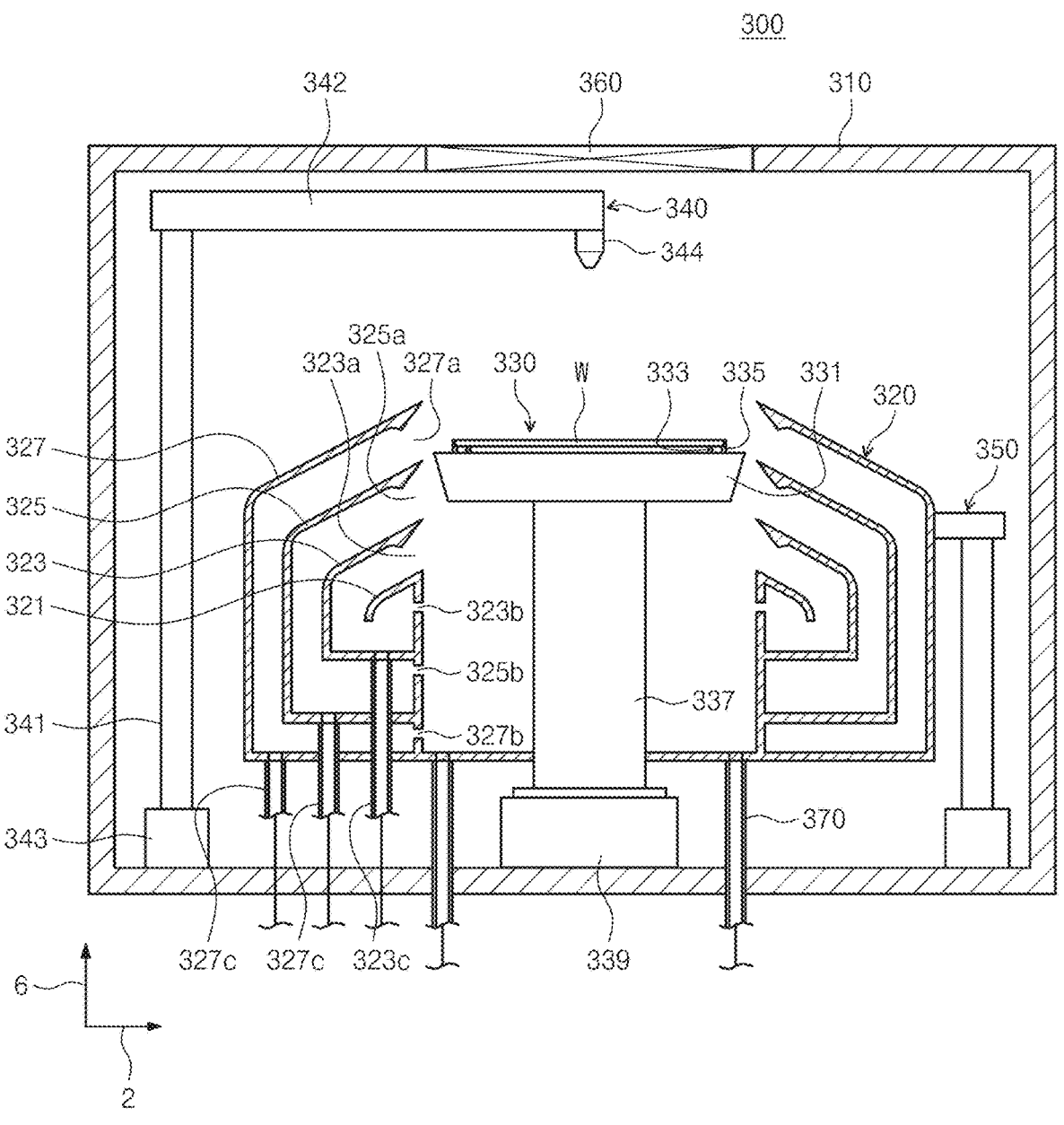
FIG. 2 is a diagram schematically illustrating an exemplary embodiment of a liquid treating chamber of FIG. 1.

FIG. 2 is a diagram schematically illustrating an exemplary embodiment of the liquid treating chamber of FIG. 1. Referring to FIG. 2, the liquid treating chamber 300 may include a housing 310, a treating container 320, a support unit 330, and a liquid supply unit 340.

The housing 310 has an inner space. The housing 310 is provided in a substantially cuboid shape. An opening (not illustrated) is formed in one side of the housing 310. The opening (not illustrated) functions as an entrance through which the substrate W is carried into or carried out from the inner space of the housing 310 by the transfer robot 540 to be described below. The treating container 320, the support unit 330, and the liquid supply unit 340 are disposed in the inner space of the housing 310.

The treating container 320 has a treating space with an opened upper portion. The treating container 320 may be a bowl having a treating space. The treating container 320 may be provided to surround the treating space. The treating space of the treating container 320 may be provided as a space in which the support unit 330 to be described below supports and rotates the substrate W. The treating space is provided as a space in which the liquid supply unit 340 to be described below supplies a liquid onto the substrate W to treat the substrate W.

According to an example, the treating container 320 may have a guide wall 321 and a plurality of recovery tanks 323, 325, and 327. The respective recovery tanks 323, 325, and 327 separate and collect different liquids among liquids used for treating the substrate W. The recovery tanks 323, 325, and 327 have recovery spaces that recover the liquids used for treating the substrate W, respectively.

The guide wall 321 and the recovery tanks 323, 325, and 327 are provided in an annular ring shape of surrounding the support unit 330. When the liquid is supplied onto the substrate W, the liquid scattered by the rotation of the substrate W may be introduced into the recovery spaces through inlets 323a, 325a, and 327a of the respective recovery tanks 323, 325, and 327 to be described below. Different types of liquids may be introduced into the respective recovery tanks 323, 325, and 327.

The treating container 320 has the guide wall 321, the first recovery tank 323, the second recovery tank 325, and the third recovery tank 327. The guide wall 321 is provided in an annular ring shape of surrounding the support unit 330.

The first recovery tank 323 is provided in an annular ring shape surrounding the guide wall 321. The second recovery tank 325 is provided in an annular ring shape surrounding the first recovery tank 323. The third recovery tank 327 is provided in an annular ring shape surrounding the second recovery tank 325.

A space between the guide wall 321 and the first recovery tank 323 functions as the first inlet 323*a* through which the liquid is introduced. The space between the first recovery tank 323 and the second recovery tank 325 functions as the second inlet 325*a* through which the liquid is introduced. The space between the second recovery tank 325 and the third recovery tank 327 functions as the third inlet 327*a* through which the liquid is introduced. The second inlet 325*a* may be located above the first inlet 323*a*, and the third inlet 327*a* may be located above the second inlet 325*a*. The liquid introduced into the first inlet 323*a*, the liquid introduced into the second inlet 325*a*, and the liquid introduced into the third inlet 327*a* may be different types of liquids.

A space between the lower end of the guide wall 321 and the first recovery tank 323 functions as the first outlet 323*b* through which fume and airflow generated from the liquid are discharged. A space between the lower end of the first recovery tank 323 and the second recovery tank 325 functions as the second outlet 325*b* through which the fume and airflow generated from the liquid are discharged. A space between the lower end of the second recovery tank 323 and the third recovery tank 327 functions as the third outlet 327*b* through which the fume and airflow generated from the liquid are discharged. The fume and airflow discharged from the first outlet 323*b*, the second outlet 325*b*, and the third outlet 327*b* are exhausted to the outside of the liquid treating chamber 300 through the exhaust unit 370 to be described below.

Recovery lines 323*c*, 325*c*, and 327*c* extending vertically downward are connected to the bottom surfaces of the respective recovery tanks 323, 325, and 327. The respective recovery lines 323*c*, 325*c*, and 327*c* discharge the liquid introduced through the respective recovery tanks 323, 325, and 327. The discharged treatment liquid may be reused through an external liquid recycling system (not illustrated).

The support unit 330 may support and rotate the substrate W in the treating space. The support unit 330 may include a spin chuck 331, a support pin 333, a chuck pin 335, a rotation shaft 337, and a driver 339.

The spin chuck 331 has an upper surface provided in a substantially circular shape when viewed from the top. An upper surface of the spin chuck 331 may have a diameter greater than the substrate W.

A plurality of support pins 333 is provided. The support pins 333 are disposed on the upper surface of the spin chuck 331. The support pins 333 are disposed on an edge portion of the upper surface of the spin chuck 331 to be spaced apart from each other at regular intervals. The support pin 333 is disposed to protrude upward from the upper surface of the spin chuck 331. The support pins 333 are disposed to have an annular ring shape as a whole by combining with each other. The support pins 333 support an edge region of the rear surface of the substrate W so that the substrate W is spaced apart from the upper surface of the spin chuck 331 at a predetermined distance.

A plurality of chuck pins 335 is provided. The chuck pins 335 are disposed relatively farther from a central region of the spin chuck 331 than the support pins 333. The chuck pins 335 are disposed to protrude upward from the upper surface of the spin chuck 331. When the substrate W is rotated, the chuck pins 335 support the side region of the substrate W so as not to deviate from an original position in a lateral direction. The chuck pin 335 is provided to enable linear movement between a standby position and a support position along a radial direction of the spin chuck 331. The standby position is defined as a position of the chuck pin 335 when the substrate W is received from the transfer robot 540 to be described below or when the substrate W is transferred to the transfer robot 540. The support position is defined as the position of the chuck pin 336 when the process is performed on the substrate W. In the support position, the chuck pins 335 are in contact with the side portion of the substrate W. The standby position is provided as a position relatively farther from the center of the spin chuck 331 than the support position.

A rotating shaft 337 is coupled with the spin chuck 331. The rotating shaft 337 is coupled with the lower surface of the spin chuck 331. The rotating shaft 337 may be provided so that the longitudinal direction faces the third direction 6. The rotating shaft 337 is provided to be rotatable by receiving power from the driver 339. The rotating shaft 337 is rotated by the driver 339, and the spin chuck 331 is rotated via the rotating shaft 337. The driver 339 rotates the rotating shaft 337. The driver 339 may vary a rotation speed of the rotating shaft 337. The driver 339 may be a motor for providing a driving force. However, the present invention is not limited thereto and may be variously modified to known devices for providing the driving force.

The liquid supply unit 340 supplies a liquid onto the substrate W. The liquid supply unit 340 supplies a treatment liquid onto the substrate W supported by the support unit 330. The treatment liquid supplied to the substrate W by the liquid supply unit 340 may be provided in a plurality of types. According to an example, the treatment liquid may be at least one of a chemical, a rinsing liquid, and an organic solvent.

The liquid supply unit 340 may include a support rod 341, an arm 342, an driver 343, and a liquid supply nozzle 344. The support rod 341 is located in the inner space of the housing 310. The support rod 341 may be located on one side of the treating container 320 in the inner space. The support rod 341 may have a rod shape so that the longitudinal direction faces in the third direction 6. The support rod 341 is rotatably provided by the driver 343 to be described below.

The arm 342 is coupled to the upper end of the support rod 341. The arm 342 extends vertically from the longitudinal direction of the support rod 341. The longitudinal direction of the arm 342 may be formed in the third direction 6. A liquid supply nozzle 344 to be described below may be fixedly coupled to an end of the arm 342.

The arm 342 may be provided to be movable forward and backward movement along the longitudinal direction. The arm 342 may be swing-moved by the driver 343 rotating the support rod 341 via the support rod 341. By the rotation of the arm 342, the liquid supply nozzle 344 may also be swing-moved between a process position and a standby position.

A process position may be a position where the liquid supply nozzle 344 faces the substrate W supported by the support unit 330. According to an example, the process position may be a position where the center of the liquid supply nozzle 344 faces the center of the substrate W supported by the support unit 330. The standby position may be a position where the liquid supply nozzle 344 is out of the process position.

The driver 343 is coupled to the support rod 341. The driver 343 may be disposed on the bottom surface of the housing 310. The driver 343 provides a driving force for rotating the support rod 341. The driver 343 may be provided as a motor for providing a driving force.

The liquid supply unit 344 supplies a liquid onto the substrate W. The liquid supply unit 344 may supply a treatment liquid onto the substrate W supported by the support unit 330. For example, the treatment liquid may be a liquid for removing a film or foreign matters remaining on the substrate W. According to an example, the first liquid may be a chemical containing an acid or alkali, such as sulfuric acid ($H_2SO_4$), nitric acid ($HNO_3$), or hydrochloric acid (HCl). In addition, the treatment liquid may be a liquid that is easily dissolved in a supercritical fluid used in the drying chamber 400 to be described below. According to an example, the treatment liquid according to an exemplary embodiment may be provided with any one of pure water and alcohol such as isopropyl alcohol (IPA).

The liquid supply nozzle 344 according to the exemplary embodiment of the present invention described above has been described as being provided in a singular form as an example, but is not limited thereto. For example, a plurality of liquid supply nozzles 344 may be provided, and each liquid supply nozzle 344 may supply a different treatment liquid onto the substrate W. According to an example, each of the liquid supply nozzles 344 may independently supply chemicals, pure water, and isopropyl alcohol onto the substrate W, and sequentially supply chemicals, pure water, and isopropyl alcohol to the substrate W.

In addition, all of the plurality of liquid supply nozzles 344 may be coupled to the arm 342. Optionally, each of the plurality of liquid supply nozzles 344 may independently have an arm, a support rod, and a driver, and independently swing-move and move forward and backward to move between the process position and the standby position.

An elevation unit 350 is disposed in the inner space of the housing 310. The elevation unit 350 controls a relative height between the treating container 320 and the support unit 330. The elevation unit 350 linearly moves the treating container 320 in the third direction 6. As a result, since the heights of the recovery tanks 323, 325, and 327 for recovering the liquid are changed according to a type of liquid supplied to the substrate W, the liquids may be separately recovered. Unlike the above, the treating container 320 is fixedly provided, and the lifting unit 350 moves the support unit 330 up and down to change the relative height between the support unit 330 and the treating container 320.

The airflow supply unit 360 supplies an airflow to the inner space of the housing 310. The airflow supply unit 360 may supply a down flow to the inner space. The airflow supply unit 360 may be provided as a fan filter unit. The airflow supply unit 360 may be provided above the housing 310. The gas supplied to the inner space of the housing 310 through the airflow supply unit 360 forms a down flow in the inner space. By-products and the like generated in the treating space during the process are discharged to the outside of the housing 310 through the exhaust unit 370 to be described below by the down flow formed in the inner space and the treating space.

The exhaust unit 370 exhausts process by-products such as fume and gas generated in the treating space. The process by-products such as fume and gas generated when liquid-treating the substrate W are exhausted by a decompression unit (not illustrated) provided in the exhaust unit 370. The exhaust unit 370 may be coupled to the bottom surface of the treating space 320. For example, the exhaust unit 370 may be disposed in a space between the rotating shaft 337 and an inner wall of the treating container 320.

The drying chamber 400 removes the liquid remaining on the substrate W using a process fluid. According to an exemplary embodiment, the drying chamber 400 removes the treatment liquid remaining on the substrate W using a supercritical fluid. In the drying chamber 400, a supercritical process is performed using the characteristics of a supercritical fluid. Representative examples thereof include a supercritical drying process and a supercritical etching process. Hereinafter, the supercritical process will be described based on the supercritical drying process. However, since this is only for convenience of description, the drying chamber 400 may perform other supercritical processes other than the supercritical drying process. According to an exemplary embodiment, supercritical carbon dioxide ($scCO_2$) may be used as the supercritical fluid.

Figure 3:
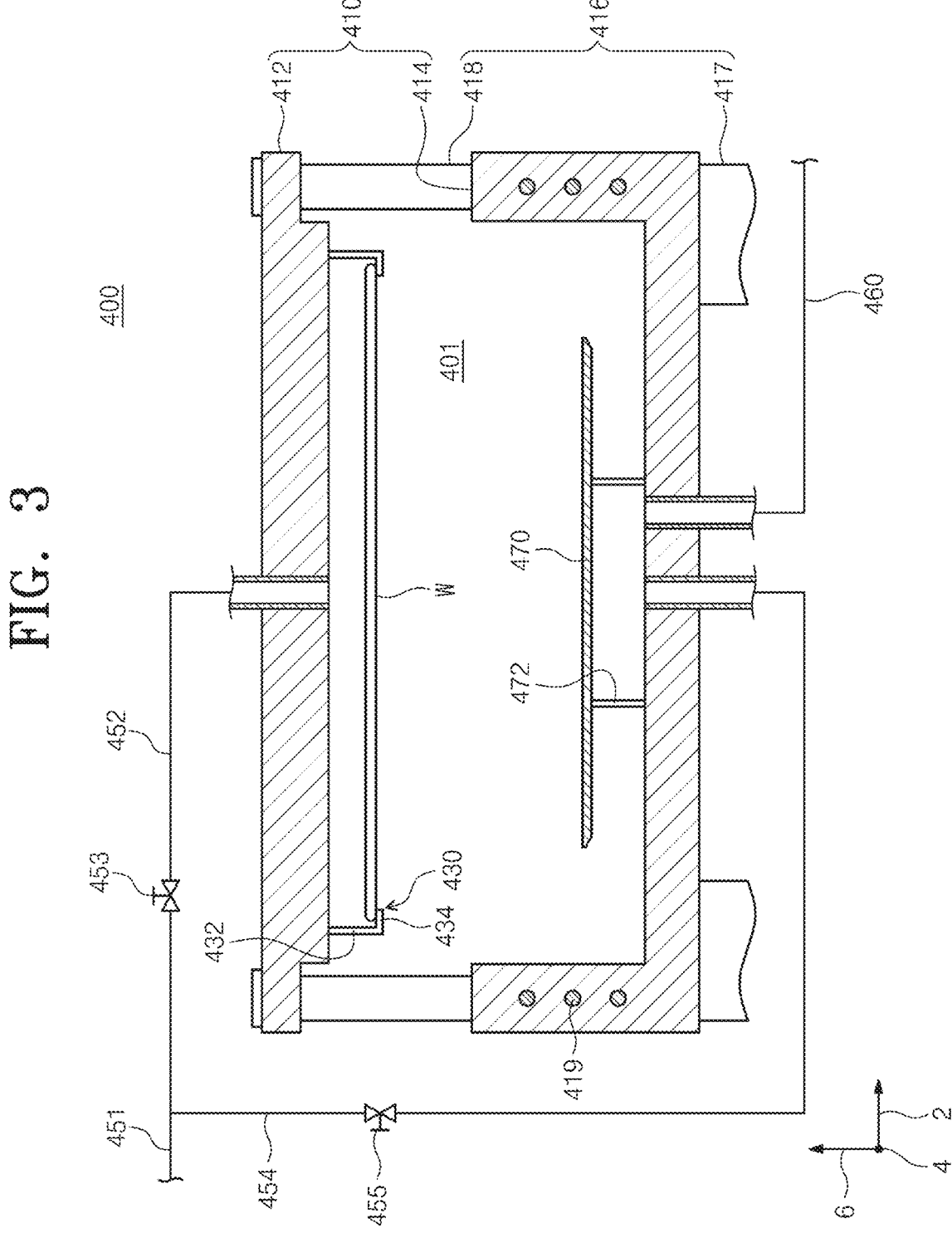
FIG. 3 is a diagram schematically illustrating an exemplary embodiment of a drying chamber of FIG. 1.

FIG. 3 is a diagram schematically illustrating an exemplary embodiment of the drying chamber of FIG. 1. Referring to FIG. 3, the drying chamber 400 may include a housing 410, a support 430, a fluid supply unit 450, an exhaust line 460, and a blocking plate 470. The housing 410 provides an inner space 401 in which a drying process on the substrate W is performed. The housing 410 may include a first body 412, a second body 414, and an elevation member 416.

The first body 412 and the second body 414 are combined with each other to provide the inner space 401. The first body 412 may be positioned above the second body 414. The position of the first body 412 is fixed, and the second body 414 may be elevated by the elevation member 416 to be described below.

When the second body 414 descends and is separated from the first body 412, the inner space 401 is opened. When the inner space 401 is opened, the substrate W may be carried into the inner space 401 or the substrate W may be carried out from the inner space 401. The substrate W carried into the inner space 401 may be a substrate W which has been liquid-treated in the liquid treating chamber 300. According to an exemplary embodiment, a treatment liquid may remain on the upper surface of the substrate W carried into the inner space 401.

When the second body 414 ascends and is in close contact with the first body 412, the inner space 401 is closed. When the inner space 401 is closed, the drying process on the substrate W may be performed by supplying the process fluid.

The elevation member 416 elevates the second body 414. The elevation member 416 may include an elevation cylinder 417 and an elevation rod 418. The elevation cylinder 417 may be coupled to the second body 414. The elevation cylinder 417 overcomes a high pressure of a critical pressure or higher of the inner space 401 while the drying process on the substrate W is performed, and may seal the inner space 401 by contacting the first body 412 and the second body 414.

The elevation rod 418 generates an elevating force in the vertical direction. For example, the elevation rod 418 may generate a force for moving in the third direction 6. The longitudinal direction of the elevation rod 418 may be formed in a vertical direction. One end of the elevation rod 418 may be inserted into the elevation cylinder 417. The other end of the elevation rod 418 may be coupled to the first body 412. The second body 414 may be moved in a vertical direction by a relative elevating motion of the elevation cylinder 417 and the elevation rod 418. While the second body 414 moves in the vertical direction, the elevation rod 418 prevents the first body 412 and the second body 414 from moving in the horizontal direction. The elevation rod 418 guides the vertical movement direction of the second body 414. The elevation rod 418 may prevent the first body 412 and the second body 414 from deviating from the original positions.

According to an example of the present invention described above, the example in which the second body 414 moves in the vertical direction to seal the inner space 401 has been described, but is not limited thereto. For example, the first body 412 and the second body 414 may move in a vertical direction, respectively. In addition, the first body 412 may move in the vertical direction, and the position of the second body 414 may be fixed.

Unlike the above example, a single housing 410 may be provided with an opening (not illustrated) through which the substrate W is carried into and out from one side of the housing 410. A door (not illustrated) may be provided in the housing 410. The door (not illustrated) may move in a vertical direction to open and close the opening (not illustrated) and maintain the housing 410 in a sealed state.

A heater 419 may be provided in the housing 410. According to an example, the heater 419 may be embedded inside a wall of at least one of the first body 412 and the second body 414. The heater 419 may heat the process fluid supplied to the inner space 401 to a critical temperature or higher to maintain the heated process fluid in a supercritical fluid phase, or heat the process fluid to return to the supercritical fluid phase when the process fluid is liquefied.

The support 430 supports the substrate W within the inner space 401. The support 430 may be fixedly provided on a lower surface of the first body 412. The support 430 may have a fixing rod 432 and a holder 434.

The fixing rod 432 may be fixedly provided to the first body 412 so as to protrude downward from the bottom surface of the first body 412. The longitudinal direction of the fixing rod 432 is provided in a vertical direction. A plurality of fixing rods 432 may be provided. The plurality of fixing rods 432 are spaced apart from each other. When the substrate W is carried into or out from a space surrounded by the plurality of fixing rods 432, the plurality of fixing rods 432 are disposed at a position which does not interfere with the substrate W. The holder 434 is coupled to each of the fixing rods 432.

The holder 434 extends from the fixing rod 432. The holder 434 may extend from a lower end of the fixing rod 432 toward a space surrounded by the fixing rods 432. The holder 434 supports an edge region of the rear surface of the substrate W. According to an example, the rear surface of the substrate W may be a surface on which no pattern is formed, and the upper surface of the substrate W may be a surface on which a pattern is formed. Due to the structure described above, the edge region of the substrate W carried into the inner space 401 may be placed on the holder 434. In addition, the entire upper surface region of the substrate W, the central region of the lower surface of the substrate W, and a part of the edge region of the lower surface of the substrate W may be exposed to the process fluid supplied to the inner space 401.

The fluid supply unit 450 supplies the process fluid to the inner space 401. The process fluid according to an example may be supplied to the inner space 401 in a supercritical state. However, the present invention is not limited thereto, and the process fluid may be supplied to the inner space 401 in a gas state and phase-changed into a supercritical state in the inner space 401. The fluid supply unit 450 may have a main supply line 451, a first branch line 452, and a second branch line 454.

One end of the main supply line 451 is connected to a supply source (not illustrated) in which the process fluid is stored. The other end of the main supply line 451 is branched into the first branch line 452 and the second branch line 454. The first branch line 452 is connected to the upper surface of the housing 410. According to an example, the first branch line 452 may be connected to the first body 412. For example, the first branch line 452 may be coupled to the center of the first body 412. The first branch line 452 may be located in an upper central region of the substrate W placed on the support 430. A first valve 453 may be installed in the first branch line 452. The first valve 453 may be provided as an opening/closing valve. The process fluid may be selectively supplied to the inner space 401 according to the opening and closing of the first valve 453.

The second branch line 454 is connected to the lower surface of the housing 410. According to an example, the second branch line 454 may be connected to the second body 414. For example, the second branch line 454 may be coupled to the center of the second body 414. The second branch line 454 may be located vertically downward from the central region of the substrate W placed on the support 430. A second valve 455 may be provided in the second branch line 454. The second valve 455 may be provided as an opening/closing valve. The process fluid may be selectively supplied to the inner space 401 according to the opening and closing of the second valve 455.

The exhaust unit 460 may exhaust an atmosphere of the inner space 401. The exhaust line 460 may be coupled to the second body 414. According to an example, when viewed from the top, the exhaust line 460 may be displaced from the center of the lower surface of the second body 414. The supercritical fluid flowing in the inner space 401 is discharged to the outside of the housing 410 through the exhaust line 460.

The blocking plate 470 is disposed in the inner space 401. When viewed from the top, the blocking plate 470 may be provided to overlap with an outlet of the second branch line 454 and an inlet of the exhaust line 460. The blocking plate 470 may prevent the substrate W from being damaged by directly discharging the process fluid supplied through the second branch line 454 toward the substrate W.

The blocking plate 470 may be spaced apart from the bottom surface of the housing 410 at a predetermined distance from the top. For example, the blocking plate 470 may be supported by the support 472 to be spaced apart from the lower surface of the housing 410 in an upper direction. The support 472 may be provided in a rod shape. A plurality of supports 472 may be provided. A plurality of supports 472 are spaced apart from each other at a predetermined distance.

Figure 4:
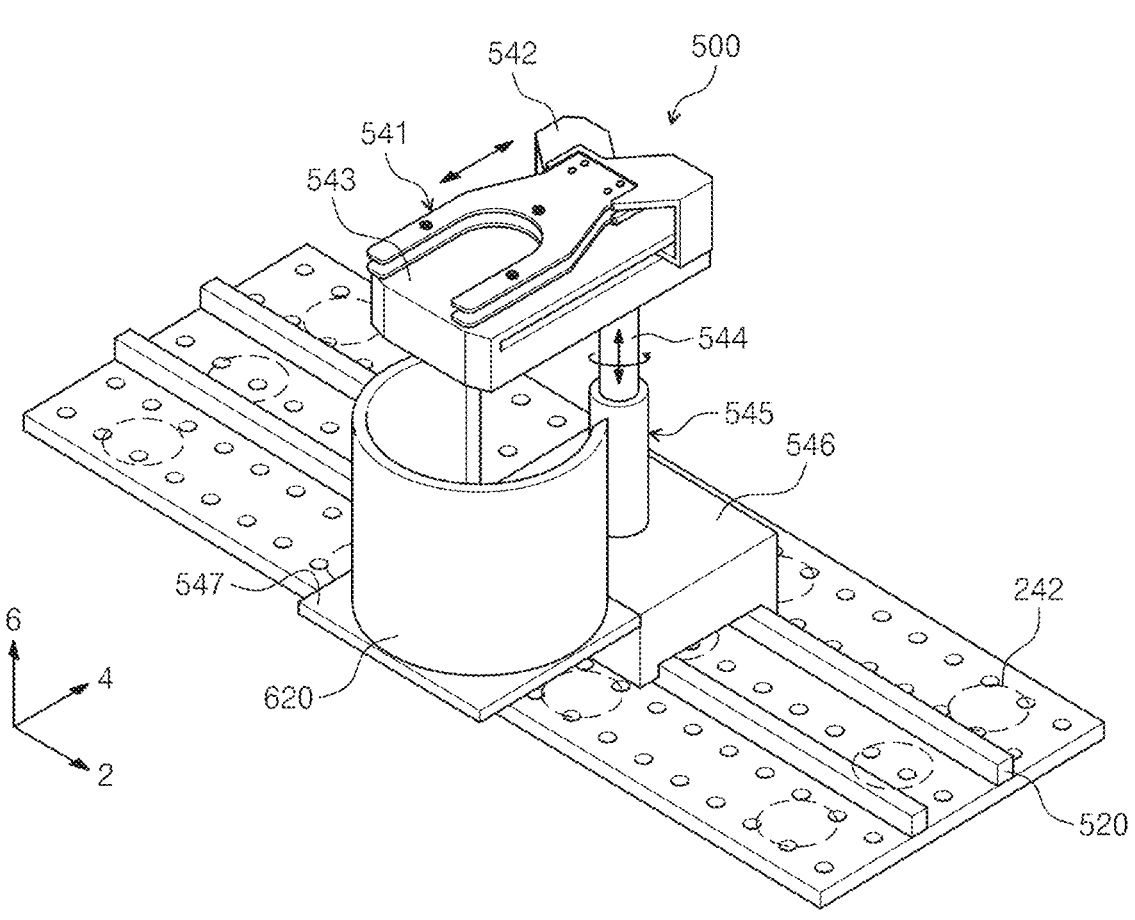
FIG. 4 is a perspective view schematically illustrating a transfer unit and a rear surface cleaning unit of FIG. 1.

FIG. 4 is a perspective view schematically illustrating an exemplary embodiment of the transfer unit and the rear surface cleaning unit of FIG. 1. Hereinafter, a transfer unit and a cleaning unit according to an exemplary embodiment of the present invention will be described in detail with reference to FIG. 4.

The transfer unit 500 is provided in a transfer space inside the transfer frame 240. The transfer unit 500 may transfer the substrate W in the transfer space. The transfer unit 500 may transfer the substrate W between the buffer unit 220, the liquid treating chamber 300, and the drying chamber 400. For example, the transfer unit 500 may transfer the substrate W from the buffer unit 220 to the liquid treating chamber 300, and transfer the substrate W which has been liquid-treated from the liquid treating chamber 300 to the drying chamber 400.

The transfer unit 500 has a guide rail 520 and a transfer robot 540. The guide rail 520 is provided in a transfer space of the transfer frame 240. For example, the guide rail 520 may be provided on a lower surface of the transfer frame 240. The guide rail 520 may be provided in parallel along the longitudinal direction of the transfer frame 240. For example, the longitudinal direction of the guide rail 520 may be formed in a direction toward the second direction 4. The transfer robot 540 to be described below is provided on the guide rail 520 and moves linearly along the longitudinal direction of the guide rail 520.

The transfer robot 540 transfers the substrate W. The transfer robot 540 may include a transfer hand 541, a hand driver 543, a rotation driver 544, a vertical driver 545, a horizontal driver 546, and an extender 547. The hand driver 543, the rotation driver 544, the vertical driver 545, and the horizontal driver 546 according to an exemplary embodiment of the present invention may be provided with known motors that transmit power.

The transfer hand 541 supports the substrate W. A pad 541a may be provided on an upper surface of the transfer hand 541. The pad 541a may support a lower surface of the substrate W. A plurality of pads 541a may be provided. According to an exemplary embodiment, three pads 541a may be provided to support the lower surface of the substrate W at three points.

A plurality of transfer hands 541 may be provided. The number of transfer hands 541 may increase or decrease according to process requirements and the like. The plurality of transfer hands 541 may be spaced apart from each other in a vertical direction. The plurality of transfer hands 541 may independently move forward, backward, and rotate. For example, when the plurality of transfer hands 541 is provided, some of the transfer hands 541 may be used to transfer the substrate W from the buffer unit 220 to the liquid treating chamber 300, and some of the transfer hands 541 may be used when transferring the substrate W which has been liquid-treated in the liquid treating chamber 300 to the drying chamber 400.

The transfer hand 541 may be coupled with a connector 542. The connector 542 may be provided in the hand driver 543 to be described below. For example, the connector 542 may be inserted into a rail groove formed in the hand driver 543. The connecter 542 may move in a horizontal direction along a rail groove formed in the hand driver 543. The transfer hand 541 may be horizontally moved by the hand driver 543 via the connector 542.

The hand driver 543 moves the connector 542. The hand driver 543 moves the transfer hand 541 via the connector 542. The hand driver 543 may horizontally move the transfer hand 541. According to an example, the transfer hand 541 is positioned above the hand driver 543, and a rail groove for guiding the horizontal movement of the transfer hand 541 may be provided on a side surface of the hand driver 543.

The rotation driver 544 moves the hand driver 543. The rotation driver 544 may rotate and move the hand driver 543 based on an axis in the third direction 6. The hand driver 543 may be provided above the rotation driver 544. According to an example, the rotation driver 544 may be coupled to a lower surface of the hand driver 543. The hand driver 543 rotates according to the rotation of the rotation driver 544, and the transfer hand 541 coupled to the upper portion of the hand driver 543 may rotate via the hand driver 543.

The vertical driver 545 may be provided below the rotation driver 544. The vertical driver 545 is coupled with the rotation driver 544 to move the rotation driver 544. For example, the vertical driver 545 may move the rotation driver 544 along the third direction 6. The vertical positions of the transfer hand 541 and the hand driver 543 may be changed. Accordingly, the transfer hand 541 may vertically move along the third direction 6.

The horizontal driver 546 may be provided below the vertical driver 545. The horizontal driver 546 may be coupled to the guide rail 520. The horizontal driver 546 may move along the guide rail 520. Accordingly, the transfer hand 541 is movable forward and backward along the guide rail 520. For example, the horizontal driver 546 may linearly move along the first direction 2. As the horizontal driver 546 moves, the substrate W seated on the transfer hand 541 may be transferred between the liquid treating chamber 300 and the drying chamber 400.

The extender 547 may extend from the horizontal driver 546. For example, the extender 547 may extend along the second direction 4 from the horizontal driver 546. A contact member 620 to be described below may be provided on the upper surface of the extender 547.

The hand driver 543, the rotation driver 544, and the vertical driver 545 described above may move the substrate W seated on the transfer hand 541 to the rear surface cleaning position. The rear surface cleaning position may be a position where the rear surface cleaning unit 600 may remove the liquid remaining on the rear surface of the substrate W. For example, the rear surface cleaning position may be a position where the contact member 620 provided on the extender 547 and the rear surface of the substrate W come into contact with each other. For example, the rear surface cleaning position may be a position where the contact member 620 to be described below comes into contact with the edge region of the substrate W seated on the transfer hand 541 when viewed from the top. In addition, the rear surface cleaning position may be a height where the rear surface of the substrate W seated on the transfer hand 541 and the upper surface of the contact member 620 correspond to each other when viewed from the front. For example, the rear surface cleaning position may be a height where the rear surface of the substrate W seated on the transfer hand 541 and the upper surface of the contact member 620 coincide with each other when viewed from the front.

The rear surface cleaning unit 600 cleans the substrate W. According to an exemplary embodiment, the rear surface cleaning unit 600 may clean the rear surface of the substrate W while transferring the substrate W. For example, the rear surface cleaning unit 600 may clean the rear surface of the substrate W while transferring the substrate W which has been liquid-treated in the liquid treating chamber 300 to the drying chamber 400. That is, the rear surface cleaning unit 600 may clean the rear surface of the substrate W while transferring the substrate W from the transfer space inside the transfer frame 240.

The rear surface cleaning unit 600 may include the contact member 620. The contact member 620 may come into contact with the rear surface of the substrate W. The contact member 620 may come into contact with the rear surface of the substrate W to remove the liquid remaining on the rear surface of the substrate W. For example, the contact member 620 may come into contact with the rear surface of the substrate W to remove the treatment liquid remaining on the edge region of the rear surface of the substrate W. The contact member 620 may be provided with a material that does not damage the substrate W. In addition, the contact member 620 may be provided with a material capable of easily absorbing the liquid. According to an example, an upper region of the contact member 620 may be provided with a material capable of easily absorbing the liquid. For example, the upper end of the contact member 620 may be provided with a synthetic resin material such as a sponge, which is an example of a porous material.

The contact member 620 may be provided at a position which does not interfere with the transfer hand 541, the connecter 542, and the hand driver 543. According to an exemplary embodiment, the contact member 620 may be provided on the upper surface of the extender 547. The contact member 620 may have a set height and a predetermined thickness. The contact member 620 may have a thickness drawn by a predetermined distance from the end of the substrate W toward the center of the substrate W when the substrate W seated on the transfer hand 541 is located at the rear surface cleaning position.

For example, the set height may be a height corresponding to a height from the lower end of the hand driver 543 to the rear surface of the substrate W placed on the transfer hand 541. Accordingly, when the substrate W seated on the transfer hand 541 moves to the rear surface cleaning position, the substrate W seated on the transfer hand 541 may move in the third direction 6 without interfering with the contact member 620. Accordingly, the rear surface of substrate W seated on the transfer hand 541 may come into contact with the upper surface of the contact member 620.

The contact member 620 may be formed to be curved. According to an example, the contact member 620 may have a curved shape with one cut portion. When viewed from the top, the cut portion of the contact member 620 may overlap with a portion of the transfer hand 541 on which the substrate W located at the rear surface cleaning position is seated.

A detailed mechanism in which the contact member 620 cleans the rear surface of the substrate W while the substrate W is transferred by the transfer robot 540 will be described below.

A member capable of wiping and removing the treatment liquid, such as a brush or a wiper, may be further provided on the upper surface of the contact member 620 according to the above-described embodiment. In the case where the brush or wiper is further provided on the upper surface of the contact member 620, when the substrate W is located at the rear surface cleaning position, the treatment liquid remaining on the rear surface of the substrate W may be removed by the brush or wiper while the rear surface of the substrate W is in contact with the brush or wiper.

Figure 5:
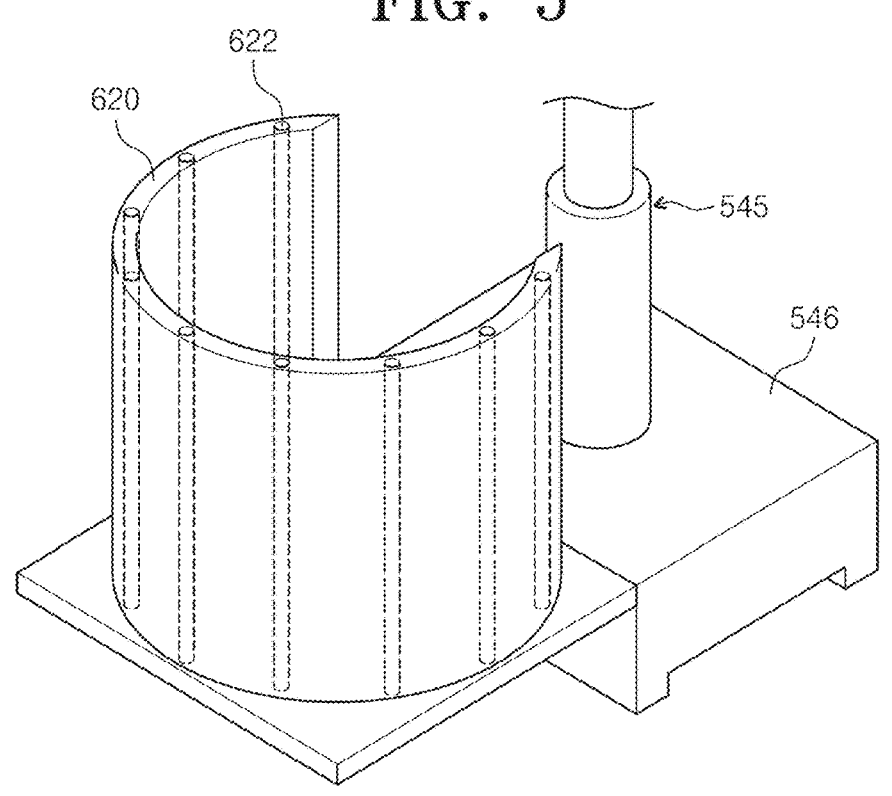
FIGS. 5 to 7 are perspective views schematically illustrating another embodiment of the rear surface cleaning unit of FIG. 4.
Figure 6:
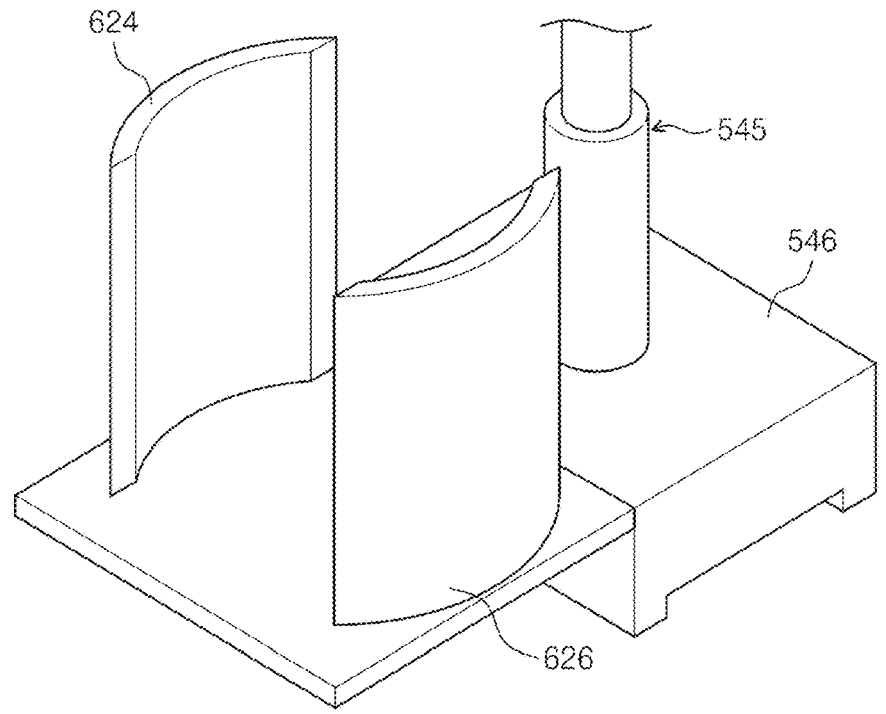
Figure 7:
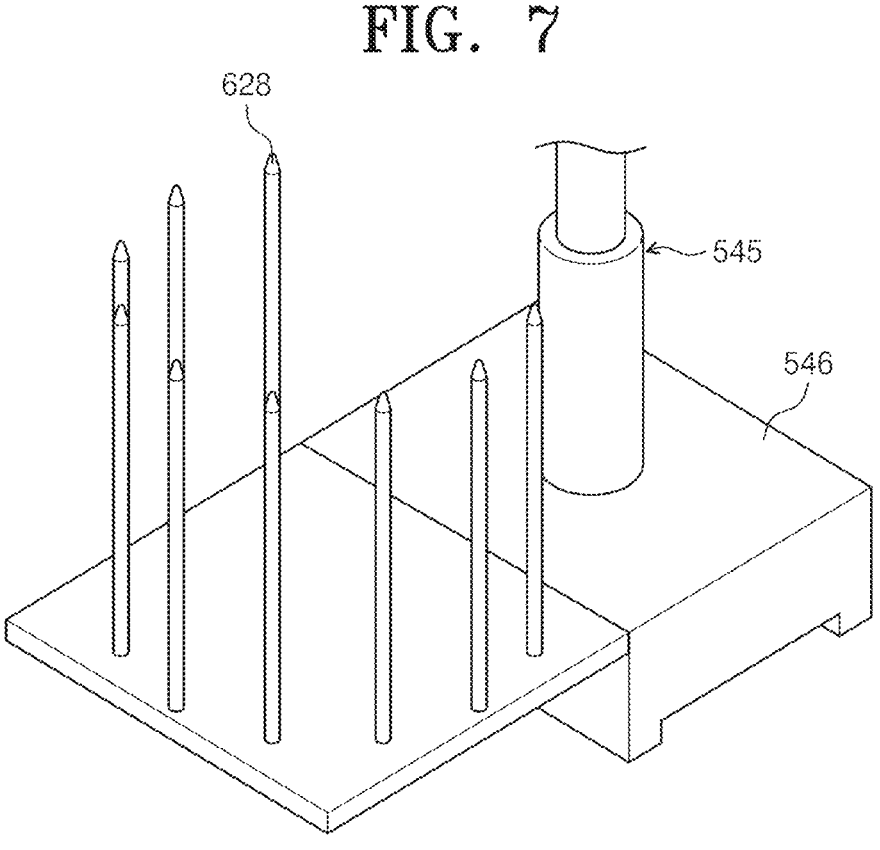

FIGS. 5 to 7 are perspective views schematically illustrating another embodiment of the rear surface cleaning unit of FIG. 4. Hereinafter, a modified embodiment of the rear surface cleaning unit of the present invention will be described in detail with reference to FIGS. 5 to 7. A rear surface cleaning unit according to an exemplary embodiment to be described below is provided almost the same as or similar to the rear surface cleaning unit described above except for cases to be described additionally, and thus, the description of the duplicated contents will be omitted.

Referring to FIG. 5, a guide hole 622 may be formed in the contact member 620 according to an example. A plurality of guide holes 622 may be provided. The plurality of guide holes 622 may be arranged along the circumferential direction of the contact member 620. The plurality of guide holes 622 may be spaced apart from each other at regular intervals. The guide hole 622 may be provided as a through hole penetrating from the upper end to the lower end of the contact member 620. The guide hole 622 may be provided as a fine hole having a small diameter.

When the substrate W placed on the transfer hand 541 is located at the rear surface cleaning position, the rear surface of the substrate W and the upper surface of the contact member 620 may be in surface contact with each other. Due to the contact between the substrate W and the contact member 620, the treatment liquid remaining on the rear surface of the substrate W may flow to the upper surface of the contact member 620. The treatment liquid flowing to the upper surface of the substrate W may flow in a direction toward the lower end of the contact member 620 along the guide holes 622 according to a capillary action.

Unlike the above example, the contact member 620 may not be provided with the guide holes 622 penetrating through the upper and lower ends of the contact member 620. According to an example, grooves may be formed on a side surface of the contact member 620. The grooves may be formed from the upper end to the lower end of the contact member 620. The treatment liquid remaining on the rear surface of the substrate W flows to the upper surface of the contact member 620, and the treatment liquid flowing to the upper surface of the contact member 620 may be removed from the substrate W through the grooves formed on the contact member 620.

Referring to FIG. 6, the contact member 620 according to an example may have a first part 624 and a second part 626. The first part 624 and the second part 626 may be provided on the upper surface of the extender 547. The first part 624 and the second part 626 may be combined with each other to have a substantially circular shape. The first part 624 and the second part 626 may be combined with each other to correspond to an edge region of the substrate W located at the rear surface cleaning position when viewed from the top. The first part 624 and the second part 626 may be located to face each other. The first part 624 and the second part 626 may be located symmetrically with each other and have symmetrical shapes.

The first part 624 and the second part 626 are provided in the same or similar structure as or to each other. Therefore, hereinafter, the first part 624 will be mainly described.

The first part 624 may be formed to be curved. The first part 624 may be formed to be curved with respect to the center of the substrate W based on when the substrate W is located at the rear surface cleaning position. The upper surface of the first part 624 may be in contact with the rear surface of the substrate W when the substrate W is located at the rear surface cleaning position. The upper surface of the first part 624 may be in contact with the edge region of the rear surface of the substrate W when the substrate W is located at the rear surface cleaning position. The upper surface of the first part 624 may be provided with a material that does not damage the substrate W. In addition, the first part 624 may be provided with a material capable of easily absorbing the liquid. According to an example, an upper region of the first part 624 may be provided with a material capable of easily absorbing the liquid. For example, an upper end of the first part 624 may be provided with a porous material.

The first part 624 may be provided at a position which does not interfere with the transfer hand 541, the connecter 542, and the hand driver 543. For example, when the substrate W placed on the transfer hand 541 is located at the rear surface cleaning position, in a space between the first part 624 and the second part 626, the transfer hand 541, the connecter 542, and a part of the hand driver 543 may be located.

Referring to FIG. 7, the contact member 620 according to an example may be provided as a contact pin 628 having a rod shape. The contact pin 628 may be coupled to an upper surface of the extender 547. A plurality of contact pins 628 may be provided. When the substrate W is located at the rear surface cleaning position, the plurality of contact pins 628 are arranged to be spaced apart from each other at predetermined distances so as to correspond to the edge region of the substrate W when viewed from the top. An end of the contact pin 628 may be convex in a direction toward the rear surface of the substrate W. The contact pins 628 having the convex ends may minimize damage to the rear surface of the substrate W when coming into contact with the rear surface of the substrate W located at the rear surface cleaning position. The treatment liquid remaining on the rear surface of the substrate W may flow along the contact pins 628 in contact with the rear surface of the substrate W.

In the above-described exemplary embodiments, it has been described that the contact member 620 is provided on the upper surface of the extender 547 as an example, but is not limited thereto. The extender 547 may not be provided in the transfer robot 540 according to an exemplary embodiment, and the contact member 620 may be provided on the upper surface of the horizontal driver 546. Optionally, the contact member 620 may be provided on the upper surface of the hand driver 543 to be in contact with the rear surface of the substrate W.

Further, in the above example, it has been described as an example that the pad 541*a* is provided on the upper surface of the transfer hand 541 to support the lower surface of the substrate W, but is not limited thereto. For example, an adsorption hole (not illustrated) for providing a vacuum force is formed on the upper surface of the transfer hand 541, and the adsorption hole (not illustrated) provides a negative pressure toward the lower surface of the substrate W to vacuum-adsorb the substrate W.

Hereinafter, a substrate treating method according to an exemplary embodiment of the present invention will be described in detail. The substrate treating method to be described below may be performed by the substrate treating apparatus 1. In addition, the controller 30 may perform the substrate treating method to be described below by controlling components provided to the transfer unit 500 and the rear surface cleaning unit 600. Hereinafter, for convenience of description, an example in which the substrate treating method according to an exemplary embodiment of the present invention is performed in the substrate treating apparatus 1 described with reference to FIGS. 1 to 4 will be described. However, the present invention is not limited thereto, and it goes without saying that the substrate treating method according to an example may be performed in the same or similar manner even in FIGS. 5 to 7.

Figure 8:
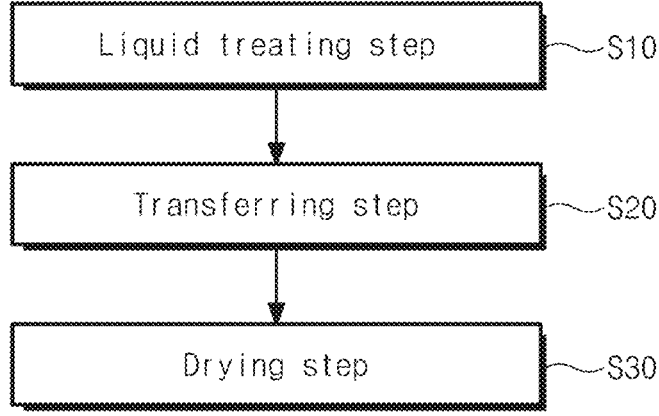
FIG. 8 is a flowchart of a substrate treating method according to an exemplary embodiment of the present invention.

FIG. 8 is a flowchart of a substrate treating method according to an exemplary embodiment of the present invention. Referring to FIG. 8, a substrate treating method according to an exemplary embodiment includes a liquid treating step (S10), a transferring step (S20), and a drying step (S30).

The liquid treating step (S10), the transferring step (S20), and the drying step (S30) may be sequentially performed. In addition, the liquid treating step (S10), the transferring step (S20), and the drying step (S30) may be collectively defined as a cleaning process.

Figure 9:
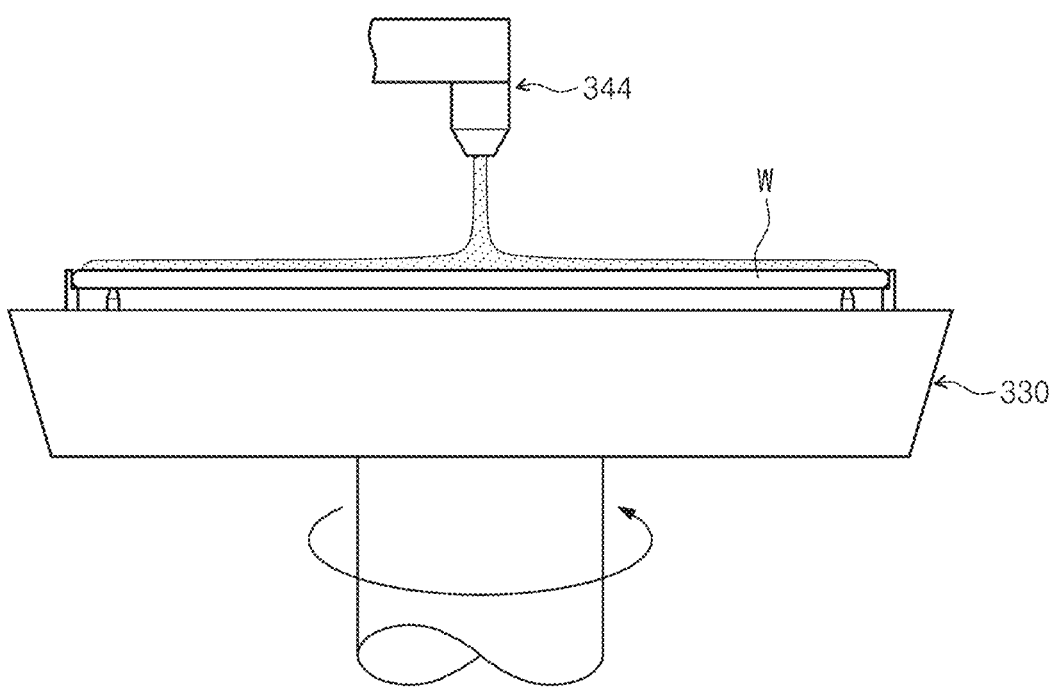
FIG. 9 is a diagram schematically illustrating a state of treating a substrate in a liquid treating step according to the exemplary embodiment of FIG. 8.

FIG. 9 is a diagram schematically illustrating a state of treating a substrate in a liquid treating step according to the exemplary embodiment of FIG. 8. Referring to FIG. 9, the liquid treating step (S10) is performed in the liquid treating chamber 300. In the liquid treating step (S10), the substrate W is liquid-treated by supplying a liquid onto the substrate W. According to an example, in the liquid treating step (S10), the substrate W may be liquid-treated by supplying a treatment liquid onto the substrate W. For example, in the liquid treating step (S10), the substrate W may be liquid-treated by supplying at least one of a chemical, a rinsing liquid, and an organic solvent onto the substrate W. For example, in the liquid treating step (S10), the substrate W may be liquid-treated by sequentially supplying a chemical, a rinsing liquid, and an organic solvent onto the substrate W.

Figure 10:
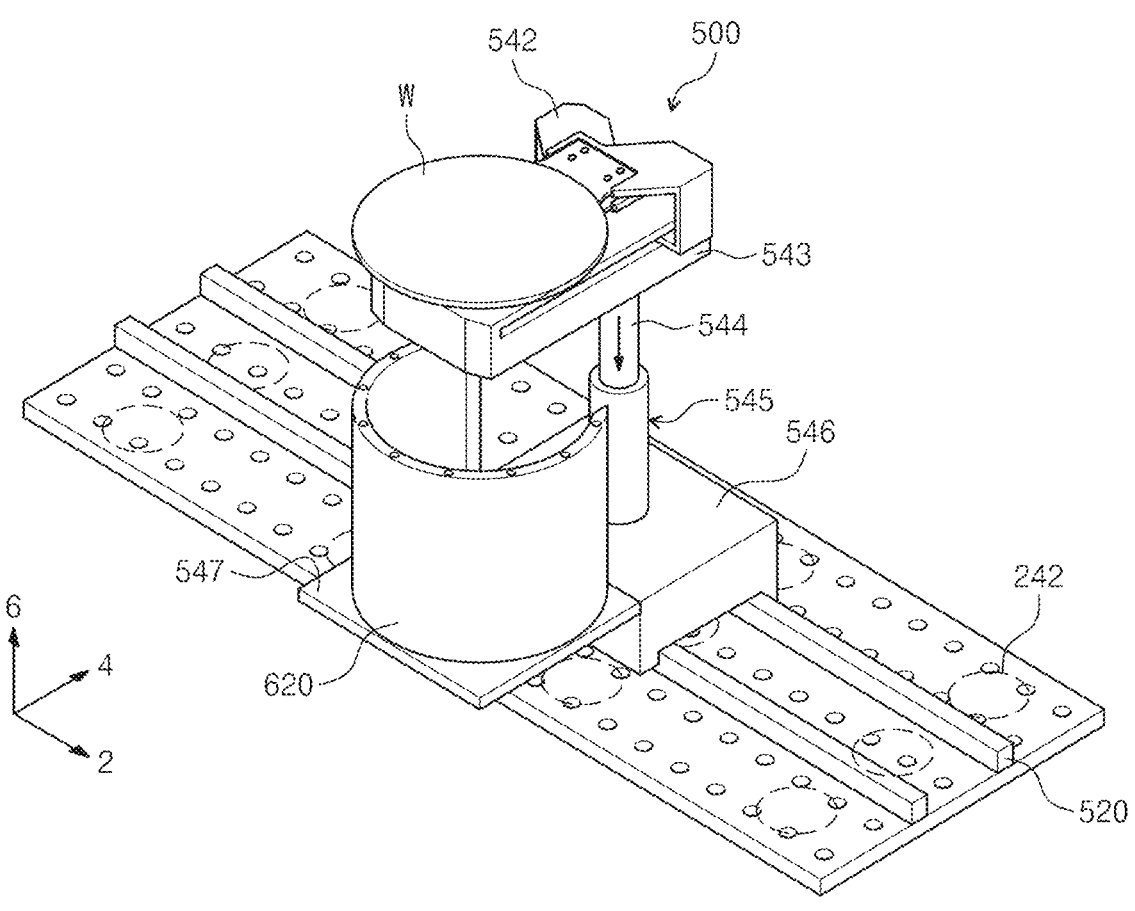
FIGS. 10 and 11 are diagrams sequentially illustrating a state in which the substrate which has been liquid-treated is located to a rear surface cleaning position in a transferring step according to the exemplary embodiment of FIG. 8.
Figure 11:
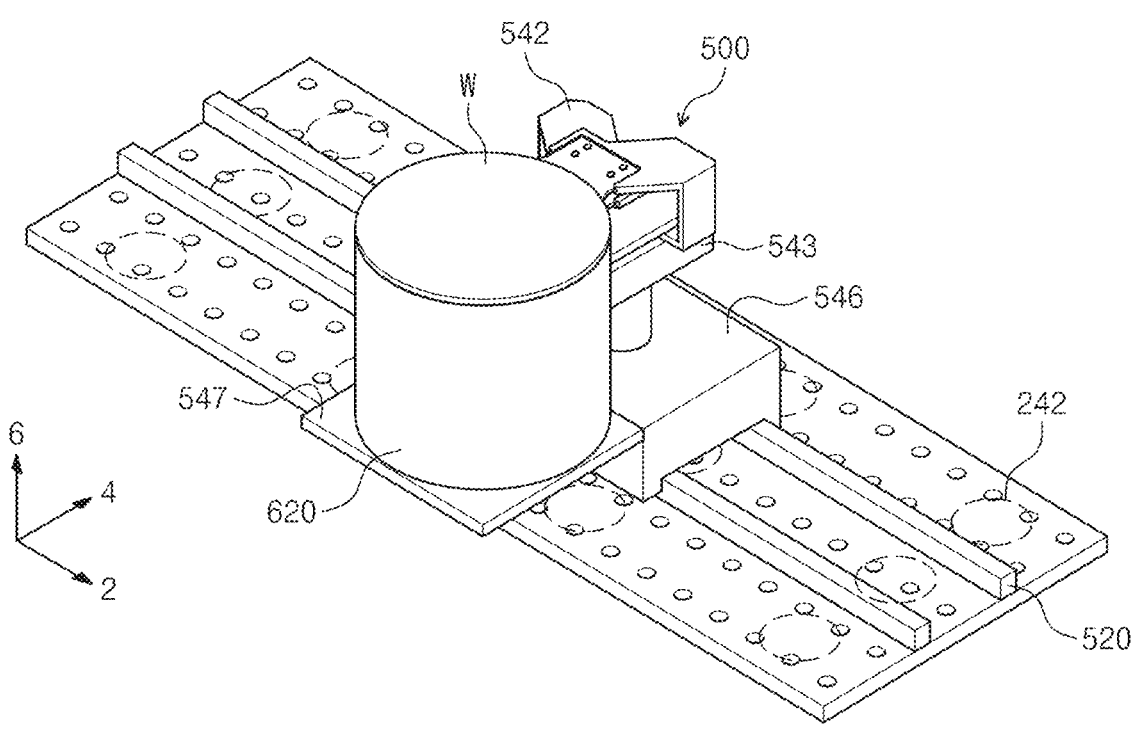

FIGS. 10 and 11 are diagrams sequentially illustrating a state in which the substrate which has been liquid-treated is located to a rear surface cleaning position in a transferring step according to the exemplary embodiment of FIG. 8. Referring to FIGS. 10 and 11, the transferring step (S20) is performed by the transfer robot 540. In the transferring step (S20), the transfer robot 540 transfers the substrate W from the liquid treating chamber 300 to the drying chamber 400. In the transferring step (S20), the transfer robot 540 carries out the substrate W, which has been liquid-treated, from the liquid treating chamber 300. The transfer robot 540 carries the substrate W carried out from the liquid treating chamber 300 into the drying chamber 400 through a transfer space inside the transfer frame 240.

In the transferring step (S20), while the substrate W is transferred from the liquid treating chamber 300 to the drying chamber 400, the treatment liquid remaining on the rear surface of the substrate W may be removed. In the transferring step (S20), while the substrate W is transferred in the transfer space inside the transfer frame 240, the substrate W is positioned at a rear surface cleaning position to remove the treatment liquid remaining on the rear surface of the substrate W.

As described above, the rear surface cleaning position may be a position where the rear surface cleaning unit 600 may remove the liquid remaining on the rear surface of the substrate W. For example, the rear surface cleaning position may be a position where the transfer robot 540 moves horizontally in the first direction 2 and/or the second direction 4 and moves downward in the third direction 6 so that the rear surface of the substrate W placed on the transfer hand 541 and the upper surface of the contact member 620 provided on the transfer robot 540 may come into contact with each other. In addition, the rear surface cleaning position may be a position where the edge region of the substrate W and the contact member 620 overlap with each other when viewed from the top. In addition, the rear surface cleaning position may be a height where the rear surface of the substrate W and the upper surface of the contact member 620 coincide with each other when viewed from the front.

The transfer robot 540 may change the position of the transfer hand 541 after carrying out the substrate W from the liquid treating chamber 300. The transfer hand 541 may be moved by the hand driver 543, the rotation driver 544, and the vertical driver 545 to be located at the rear surface cleaning position.

For example, as illustrated in FIG. 10, after the transfer hand 541 carries out the substrate W, which has been liquid-treated, from the liquid treating chamber 300, the hand driver 543 and the rotation driver 544 move the transfer hand 541 may change a horizontal position of the substrate W placed on the transfer hand 541. The horizontal position may be a position where the edge region of the substrate W placed on the transfer hand 541 and the contact member 620 overlap with each other when viewed from the top.

When the substrate W placed on the transfer hand 541 is located at the horizontal position, as illustrated in FIG. 11, the vertical driver 545 lowers the transfer hand 541 in the third direction 6 to be positioned so that the rear surface of the substrate W placed on the transfer hand 541 and the upper surface of the contact member 620 may come into contact with each other. More specifically, the vertical driver 545 lowers the substrate W located at the horizontal position to locate the substrate W at the rear surface cleaning position. Accordingly, the rear edge region of the rear surface of the substrate W and the upper surface of the contact member 620 may be in contact with each other.

Accordingly, in the process of supplying the treatment liquid from the liquid treating chamber 300 to the substrate W, the treatment liquid that has flowed to the rear surface of the substrate W by deviating from the edge region of the substrate W may be removed by the contact member 620. In addition, according to an exemplary embodiment of the present invention, in the process of transferring the substrate W from the liquid treating chamber 300 to the drying chamber 400, the treatment liquid remaining on the rear surface of the substrate W is removed to increase the efficiency of the treating process of the substrate W. In addition, according to an exemplary embodiment of the present invention, since a fan filter unit (not illustrated) and the exhaust member 242 are provided inside the transfer frame 240, the treatment liquid removed from the transfer space may be preemptively discharged from the transfer space without affecting a chamber in which a subsequent process is performed.

In the transferring step (S20) according to the above-described embodiment, the process of cleaning the rear surface of the substrate W may be performed while the transfer robot 540 is moved in the first direction 2 which is the longitudinal direction of the transfer frame 240 by the horizontal driver 546. Unlike this, after the substrate W, which has been liquid-treated, is carried out from the liquid treating chamber 300, while the transfer robot 540 is stopped in the first direction 2, the process of cleaning the rear surface of the substrate W may be performed in the transferring step (S20) while performing only the vertical movement in the third direction 6.

Figure 12:
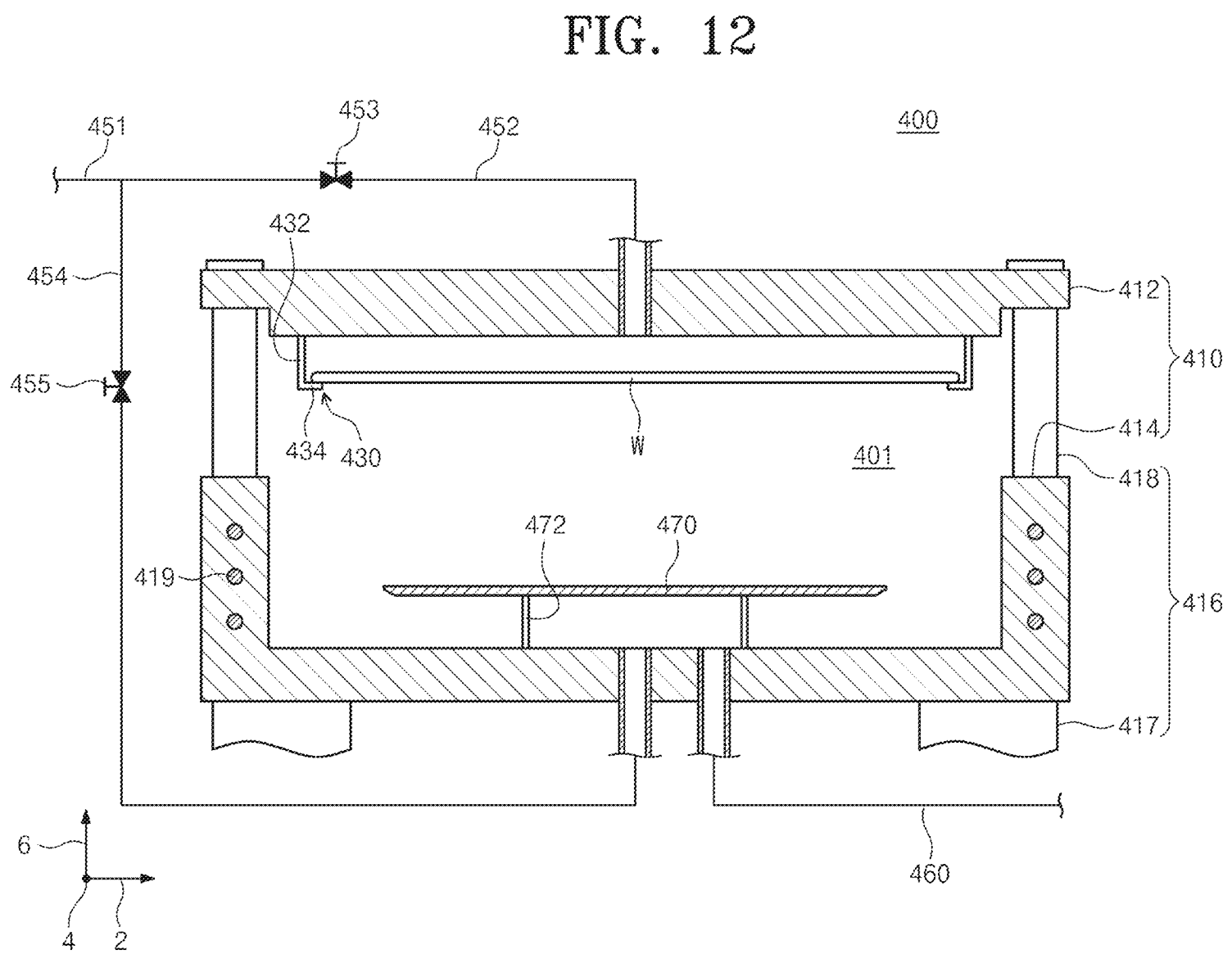
Figure 13:
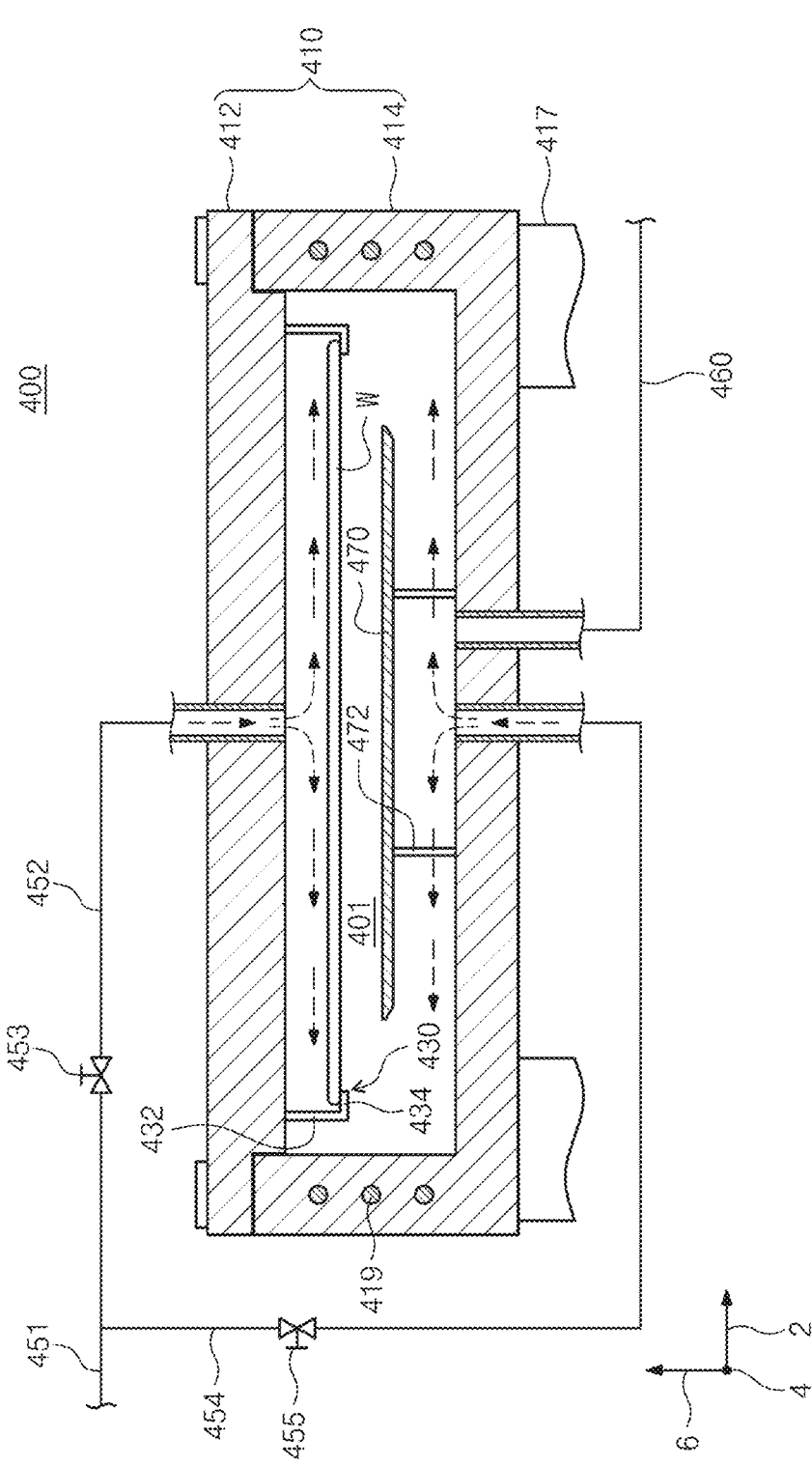

FIGS. 12 to 13 are diagrams sequentially illustrating a state in which the substrate is dried in the drying step according to the exemplary embodiment of FIG. 8. Referring to FIGS. 12 and 13, the drying step (S30) is performed in the drying chamber 400. In the transferring step (S20), the substrate W transferred by the transfer robot 224 is carried into the inner space 401 of the drying chamber 400. In the drying step (S30), the liquid remaining on the substrate W is removed by supplying a process fluid to the substrate W carried into the drying chamber 400.

In the drying step (S30), the substrate W is transferred to the support 430 in a state in which the inner space 401 is open. The substrate W transferred to the support 430 may be a substrate W, which has been liquid-treated in the liquid treating chamber 300 and of which the rear surface has been cleaned by the rear surface cleaning unit 600. The substrate W transferred to the inner space 401 of the drying chamber 400 may be dried while the edge region of the rear surface thereof is supported by the support 430.

When the substrate W is seated on the support 430, the first body 412 and the second body 414 come into close contact with each other so that the inner space 401 is sealed from the outside. For example, when the substrate W is seated on the holder 434 and the edge region of the rear surface of the substrate W is supported, the inner space 401 is converted into a sealed state. After the inner space 401 is sealed, the fluid supply unit 450 supplies the process fluid to the inner space 401. According to an example, the fluid supply unit 450 may supply a supercritical fluid to the inner space 401. The substrate W is dried by supplying the process fluid to the inner space 401. That is, the treatment liquid remaining on the upper surface of the substrate W is removed by supplying the process fluid to the inner space 401.

After the inner space 401 is sealed, the process fluid may be preemptively supplied to the inner space 401 through the second branch line 454 by opening the second valve 455. After the process fluid is supplied to a lower region of the inner space 401, the process fluid may be supplied to the inner space 401 through the first branch line 452 by opening the first valve 453.

Since the initial drying of the substrate is performed in a state where the inner space 401 is lower than a critical pressure, the process fluid supplied to the inner space 401 may be liquefied. When the process fluid is supplied to the inner space 401 through the first branch line 452 at the beginning of drying the substrate, the process fluid may be liquefied to fall to the substrate W by the gravity, thereby damaging the substrate W. Accordingly, in the drying step (S30) according to an exemplary embodiment of the present invention, the process fluid is preemptively supplied to the inner space 401 through the second branch line 454, so that the pressure of the inner space 401 reaches the critical pressure, and then the supply of the process fluid starts from the first branch line 452 to liquefy the process fluid supplied to the inner space 401, thereby minimizing the damage to the substrate W.

In the latter part of the drying step (S30), an internal atmosphere of the internal space 401 is exhausted through the exhaust line 460. When the pressure in the inner space 401 drops below the critical pressure, the process fluid may be liquefied. The liquefied process fluid may be exhausted via exhaust line 460 by gravity.

Figure 14:
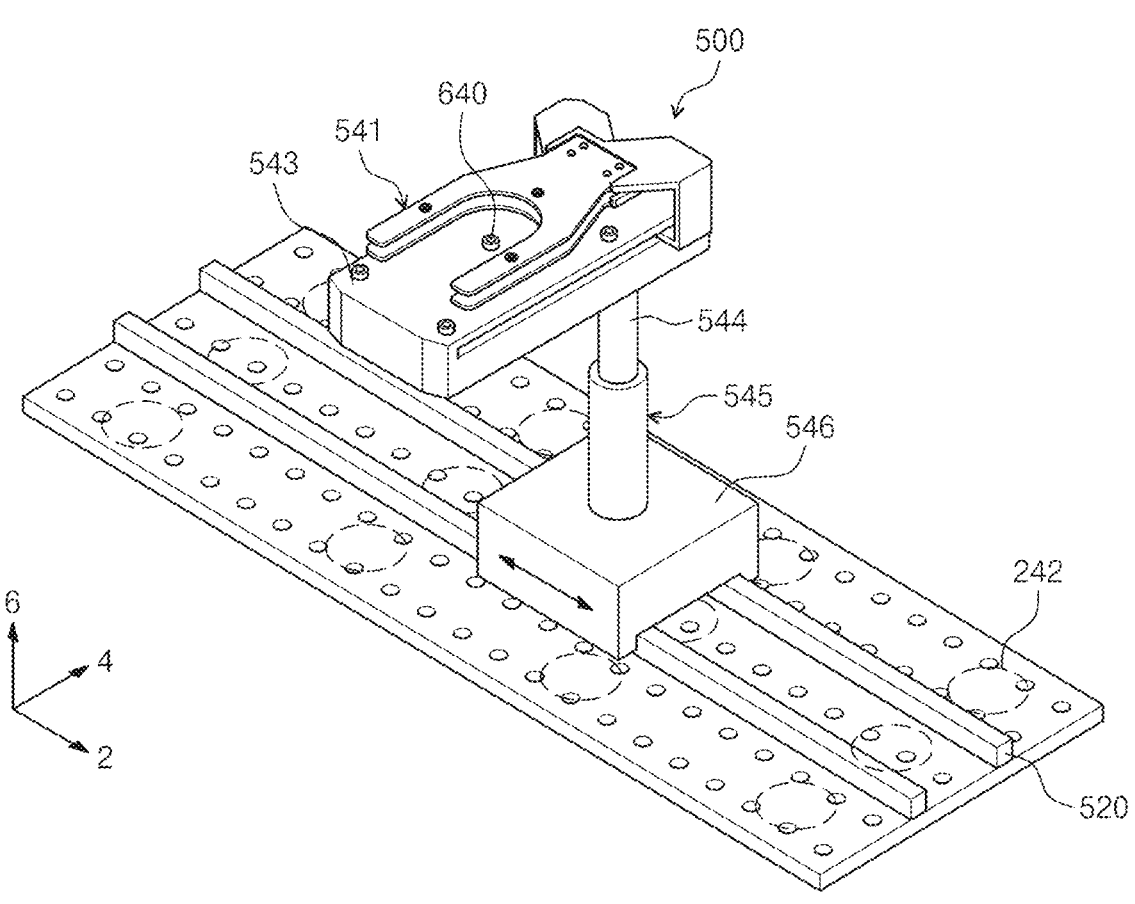
FIG. 14 is a perspective view schematically illustrating another embodiment of the rear surface cleaning unit of FIG. 4.
Figure 15:
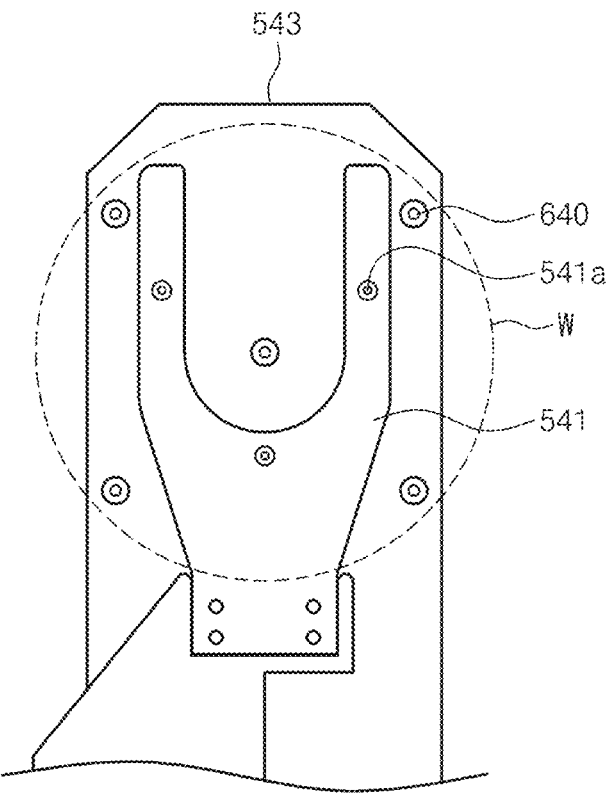
FIG. 15 is a diagram schematically illustrating an exemplary embodiment of the rear surface cleaning unit of FIG. 14 when viewed from the top.

FIG. 14 is a perspective view schematically illustrating another embodiment of the rear surface cleaning unit of FIG. 4. FIG. 15 is a diagram schematically illustrating an exemplary embodiment of the rear surface cleaning unit of FIG. 14 when viewed from the top.

Referring to FIGS. 14 and 15, the rear surface cleaning unit 600 may be provided as a non-contact member 640. The non-contact member 620 may supply a decontamination source toward the rear surface of the substrate W. The non-contact member 640 may not physically contact the rear surface of the substrate W. The non-contact member 640 may be provided on the transfer robot 540. According to an exemplary embodiment, the non-contact member 640 may be provided on the hand driver 543.

When viewed from the top, the non-contact member 640 may be provided at a position overlapping with the edge region of the substrate W seated on the transfer hand 541. Further, when viewed from the front, the non-contact member 640 may be provided at a position spaced apart from the rear surface of the substrate W seated on the transfer hand 541. Accordingly, the non-contact member 640 may be provided at a position spaced apart from the rear surface of the substrate W.

A plurality of non-contact members 640 may be provided. When viewed from the top, the plurality of non-contact members 640 may be spaced apart from each other along a circumferential direction of the edge region of the substrate W. The non-contact member 640 according to an example may be provided as an air supply device of supplying an air which is a decontamination source. For example, the non-contact member 640 may be provided with an air blow port in which the air flows on the upper surface of the hand driver

543. The air blow port may be connected with an air supply source (not illustrated) to supply the air toward the rear surface of the substrate W.

Figure 16:
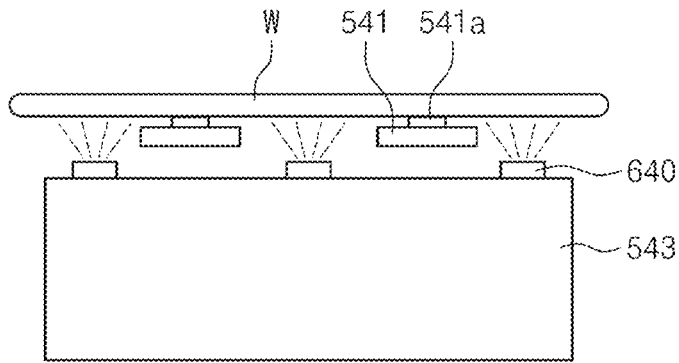
FIG. 16 is a diagram illustrating a state in which the rear surface cleaning unit cleans a rear surface of the substrate according to the exemplary embodiment of FIG. 14 when viewed from the front.

FIG. 16 is a diagram illustrating a state in which a rear surface cleaning unit cleans the rear surface of the substrate according to an exemplary embodiment of FIG. 14. Referring to FIG. 16, the transfer robot 540 transfers the substrate W, which has been liquid-treated in the liquid treating chamber 300, to the drying chamber 400. While the transfer robot 540 transfers the substrate W, which has been liquid-treated, the non-contact member 640 according to an example supplies the air toward the rear surface of the substrate W. The air supplied to the edge region of the rear surface of the substrate W may collide with the rear surface of the substrate W and spread radially. Accordingly, the treatment liquid remaining on the edge of the substrate W may be pushed and removed outside of the rear edge of the substrate W by the air supplied from the non-contact member 640.

Unlike the example, the decontamination source supplied by the non-contact member 620 toward the rear surface of the substrate W may be a heat source. The non-contact member 620 according to an example may be provided as a heating element. The heating element may be provided with a known heater.

An on/off switch (not illustrated) may be connected to the non-contact member 620. The non-contact member 620 may apply heat toward the rear surface of the substrate W from the non-contact member 640 while transferring the substrate W, which has been liquid-treated the liquid treating chamber 300, to the drying chamber 400. In addition, the non-contact member 620 may apply heat toward the rear surface of the substrate W from the non-contact member 640 only when the substrate W, which has been liquid-treated, is transferred. The treatment liquid remaining on the rear surface of the substrate W, which has been liquid-treated, may be removed due to heat applied to the rear surface of the substrate W during transferring.

Unlike the aforementioned example, the non-contact member 640 may be provided on the upper surface of the horizontal driver 546. When the non-contact member 640 is provided on the upper surface of the horizontal driver 546, the non-contact member 640 supplies an air toward the rear surface of the substrate W after the substrate W placed on the transfer hand 541 moves downward in the third direction 6 so as to remove the treatment liquid remaining on the rear surface of the substrate W. Optionally, the transfer unit 540 may be further provided with an extender 547, and the non-contact member 640 may also be provided on an upper surface of the extender 547.

Figure 17:
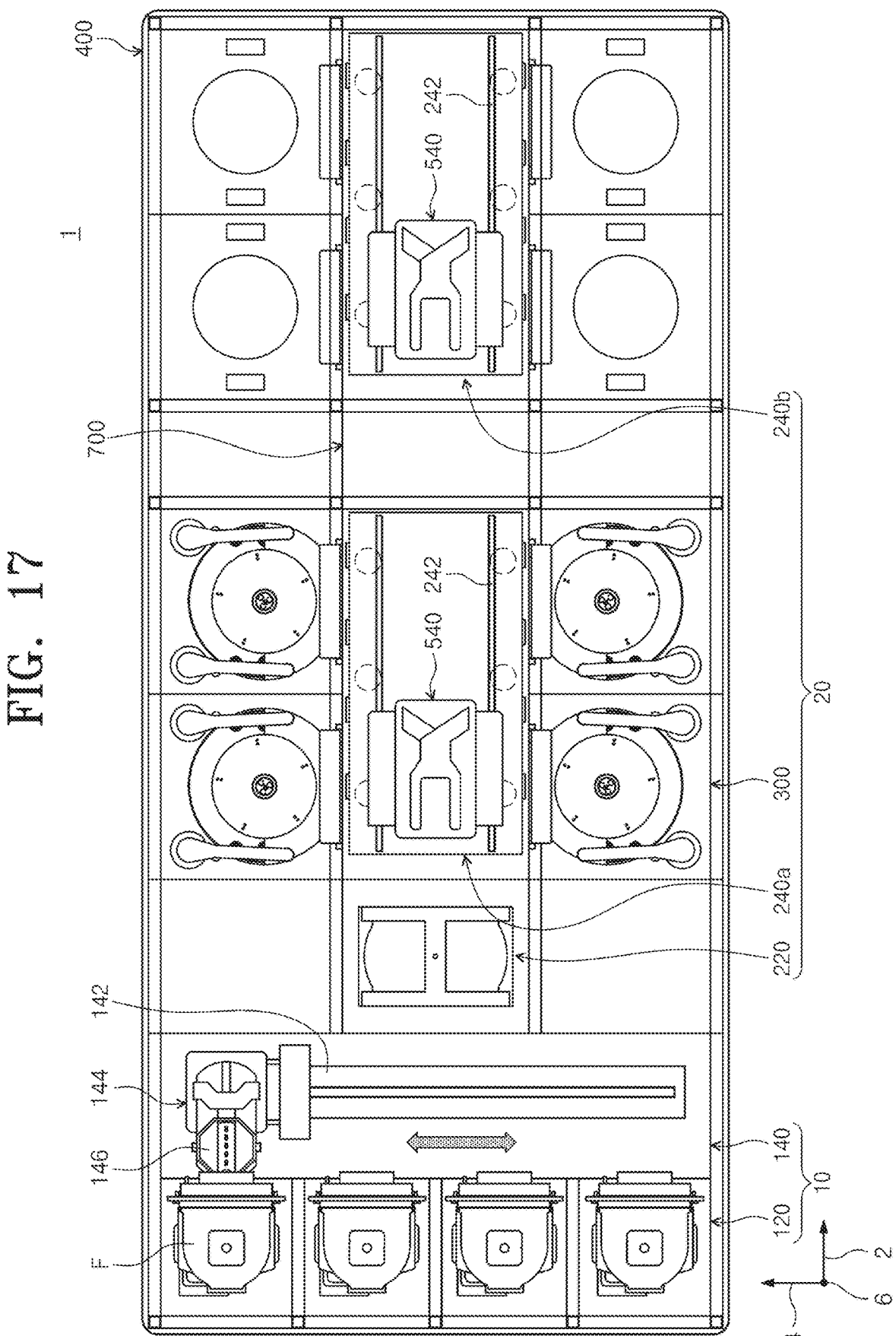
FIG. 17 is a diagram schematically illustrating another embodiment of the substrate treating apparatus of FIG. 1.

FIG. 17 is a diagram schematically illustrating another embodiment of the substrate treating apparatus of FIG. 1. The substrate treating apparatus according to an exemplary embodiment to be described below is provided most similarly to the substrate treating apparatus except for the transfer frame 240, and therefore, the descriptions of duplicated contents will be omitted.

The transfer frame 240 may have a first transfer frame 240*a* and a second transfer frame 240*b*. A longitudinal direction of each of the first transfer frame 240*a* and the second transfer frame 240*b* may be disposed along the first direction 2. The first transfer frame 240*a* may be disposed relatively more adjacent to the buffer unit 220 than the second transfer frame 240*b*. The liquid treating chambers 300 may be disposed on both sides of the first transfer frame 240*a*. The liquid treating chambers 400 may be disposed on both sides of the first transfer frame 240*a*. The rear surface cleaning frame 700 to be described below may be disposed between the first transfer frame 240*a* and the second transfer frame 240*b*. Accordingly, the first transfer frame 240*a* and the second transfer frame 240*b* may be disposed symmetrically with each other based on the rear surface cleaning frame 700.

One side of the first transfer frame 240*a* may face the front surface of the buffer unit 220. The other side facing one side of the first transfer frame 240*a* may face the front surface of the rear surface cleaning frame 700 to be described below. One side of the second transfer frame 240*b* may face the rear surface of the rear surface cleaning frame 700.

The first transfer frame 240*a* has a first transfer space in which the substrate W is transferred therein. The first transfer space functions as a space for transferring the substrate W, which has been liquid-treated in the liquid treating chamber 300, to the rear surface cleaning frame 700 to be described below. The second transfer frame 240*b* has a second transfer space in which the substrate W is transferred therein. The second transfer space functions as a space for transferring the substrate W of which the treatment liquid is removed from the rear surface from the rear surface cleaning frame 700 to the drying chamber 400.

Components of the transfer unit 500 described above are disposed on the first transfer frame 240*a* and the second transfer frame 240*b*, respectively. For example, the guide rail 520 and the transfer robot 540 descried above may be disposed between the first transfer frame 240*a* and the second transfer frame 240*b*. In addition, each of the first transfer frame 240*a* and the second transfer frame 240*b* may be provided with a fan filter unit (not illustrated) on the upper surface thereof, and an exhaust member 242 on the lower surface thereof.

Figure 18:
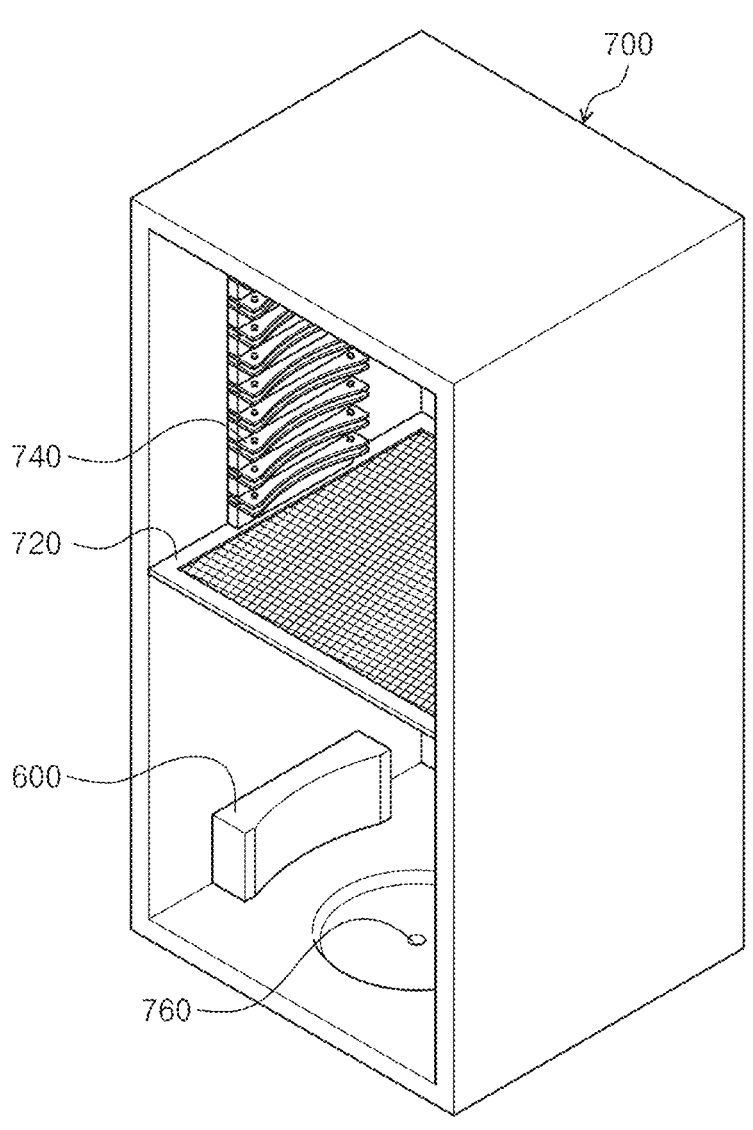
FIG. 18 is a perspective view schematically illustrating an exemplary embodiment of a rear surface cleaning frame of FIG. 17.

FIG. 18 is a perspective view schematically illustrating an exemplary embodiment of the rear surface cleaning frame of FIG. 17. Referring to FIG. 18, the rear surface cleaning frame 700 may remove the treatment liquid remaining on the rear surface of the substrate W. For example, the rear surface cleaning frame 700 may remove the treatment liquid remaining on the rear surface of the substrate W, which has been liquid-treated in the liquid treating chamber 300. The rear surface cleaning frame 700 may store the substrate W, which has been liquid-treated in the liquid treating chamber 300. For example, in the rear surface cleaning frame 700, the substrate W of which the treatment liquid is removed from the rear surface may be stored. The rear surface cleaning frame 700 may be disposed between the first transfer frame 240*a* and the second transfer frame 240*b*.

The rear surface cleaning frame 700 may be provided as a housing with open front and rear surfaces and an internal space. In an example, the rear surface cleaning frame 700 may be provided in a substantially hexahedral shape. The substrate W, which has been liquid-treated in the liquid treating chamber 300, may be located in the inner space of the rear surface cleaning frame 700. The open front surface of the rear surface cleaning frame 700 may face the first transfer frame 240*a*. The open rear surface of the rear surface cleaning frame 700 may face the second transfer frame 240*b*. Thus, the substrate W, which has been liquid-treated from the liquid treating chamber 300, may be carried into the open front surface of the rear surface cleaning frame 700 by the transfer robot 540. In addition, the substrate W, on which a predetermined treatment has been completed in the rear surface cleaning frame 700, may be transferred to the drying chamber 400 through the open rear surface of the rear surface cleaning frame 700.

A partition plate 720, an atmospheric slot 740, and an exhaust hole 760 may be provided in the inner space of the rear surface cleaning frame 700. In addition, the rear surface cleaning unit 600 described above may be provided in the inner space of the rear surface cleaning frame 700. The rear surface cleaning unit 600 provided in the inner space of the rear surface cleaning frame 700 is provided the same as or similar to the exemplary embodiments described with reference to FIGS. 1 to 16. That is, according to an example, a contact member 620 or a non-contact member 640 may be provided in the rear surface cleaning frame 700. The contact member 620 or the non-contact member 640 provided on the rear surface cleaning frame 700 according to an example may be provided on the bottom surface of the rear surface cleaning frame 700.

The partition plate 720 may have a mesh structure so that the atmosphere in the inner space is smoothly exhausted through an exhaust hole 760 to be described below. The partition plate 720 may partition the inner space of the rear surface cleaning frame 700. For example, the partition plate 720 may partition the inner space of the rear surface cleaning frame 700 into an upper standby region and a lower cleaning region.

The upper standby region may be provided as a space in which a standby slot 740 to be described below is provided. The lower cleaning region may be provided as a space in which the rear surface cleaning unit 600 is provided. According to an example, the upper standby region may be provided as a space in which the substrate W of which the treatment liquid is removed from the rear surface stands by. Unlike this, the upper standby region may be provided as a space in which the substrate W before the treatment liquid is removed from the rear surface stands by. Hereinafter, for convenience of explanation, the upper standby region will be described as an example of a space in which the substrate W stands by after the treatment liquid is removed from the rear surface.

The standby slot 740 may be formed on an inner surface of the rear surface cleaning frame 700. A plurality of standby slots 740 may be provided. The plurality of standby slots 740 may be disposed to be vertically spaced apart from each other. The longitudinal direction of the standby slot 740 may be formed along the inner surface of the rear surface cleaning frame 700. The standby slot 740 may be formed to protrude from the inner surface of the rear surface cleaning frame 700. The standby slot 740 may have a substantially arc shape. However, the standby slot 740 is not limited thereto, and the standby slot 740 may have a rectangular shape when viewed from the top. The standby slot 740 overlaps with an edge region of the substrate W when viewed from the top.

The substrate W, which has been liquid-treated in the liquid treating chamber 300, may be seated on the upper surface of the standby slot 740. The edge region of the substrate W seated on the standby slot 740 may be supported by the standby slot 740. According to an example, the substrate W seated on the standby slot 740 may be a substrate W of which the treatment liquid is removed from the rear surface after the liquid treatment has been completed.

The exhaust hole 780 may be formed on a bottom surface of the rear surface cleaning frame 700. The exhaust hole 780 may exhaust the atmosphere of the inner space of the rear surface cleaning frame 700. The exhaust hole 780 may exhaust particles, process by-products, and the like generated in the process of removing the treatment liquid remaining on the rear surface of the substrate W in the lower region of the rear surface cleaning frame 700.

Figure 19:
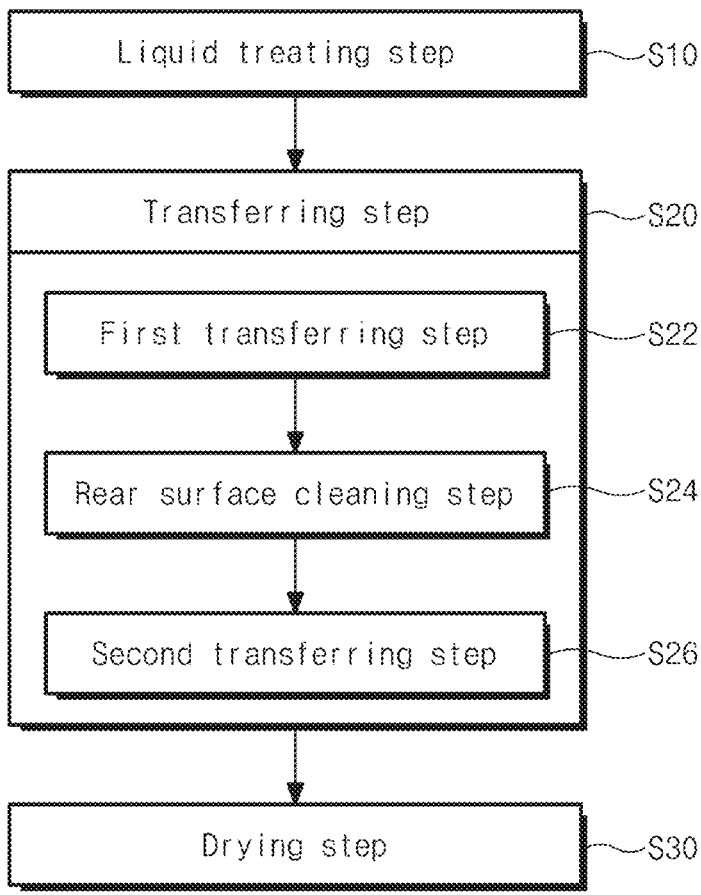
FIG. 19 is a flowchart of a substrate treating method according to another embodiment of the present invention.
Figure 20:
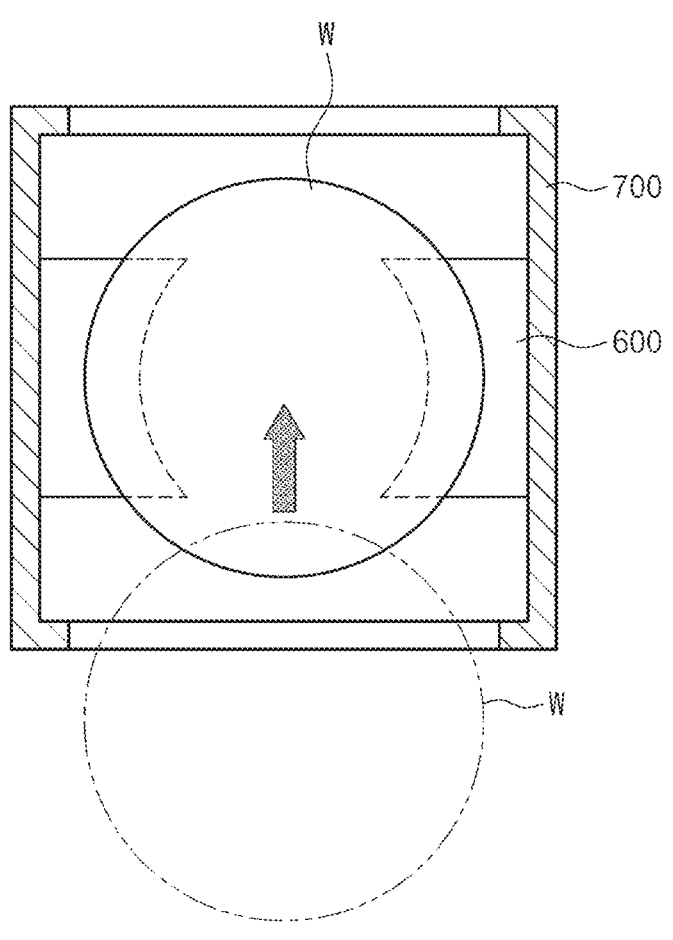
FIG. 20 is a diagram illustrating a state in which the rear surface of the substrate is cleaned in a rear surface cleaning step according to the exemplary embodiment of FIG. 19.

FIG. 19 is a flowchart of a substrate treating method according to another embodiment of the present invention. FIG. 20 is a diagram illustrating a state in which a rear surface of the substrate is cleaned in a rear surface cleaning step according to an exemplary embodiment of FIG. 19. Hereinafter, for convenience of explanation, an example in which the contact member 620 according to an example is provided in the inner space of the rear surface cleaning frame 700 in the substrate treating method according to an exemplary embodiment of the present invention will be described. However, the present invention is not limited thereto, and the substrate treating method according to an exemplary embodiment of the present invention may be equally applied even when the non-contact member 640 is provided inside the rear surface cleaning frame 700.

Referring to FIGS. 19 and 20, a substrate treating method according to an exemplary embodiment of the present invention includes a liquid treating step (S10), a transferring step (S20), and a drying step (S30). The transferring step (S20) may include a first transferring step (S22), a rear surface cleaning step (S24), and a second transferring step (S26).

In the first transferring step (S22), the transfer robot 540 may transfer the substrate W, on which the liquid treating step (S10) has been completed in the liquid treating chamber 300, to the inner space of the rear surface cleaning frame 700 through the first transfer space. In the first transferring step (S22), the substrate W, on which the liquid treating step (S10) has been completed in the liquid treating chamber 300, may be transferred to the inner space of the rear surface cleaning frame 700 through the open front surface of the rear surface cleaning frame 700.

In the rear surface cleaning step (S24), the transfer robot 540 locates the transfer hand 541 in the lower cleaning region of the inner space of the rear surface cleaning frame 700. When the transfer hand 541 is located in the lower cleaning region, the transfer robot 540 moves in a horizontal direction so that the rear surface of the substrate W seated on the transfer hand 541 comes into contact with the upper surface of the contact member 620. As illustrated in FIG. 20, the edge region of the rear surface of the substrate W seated on the transfer hand 541 overlaps with the upper surface of the contact member 620 when viewed from the top. Accordingly, by the movement of the transfer hand 541 in the horizontal direction, the edge region of the rear surface of the substrate W comes into contact with the upper surface of the contact member 620, and in this process, the treatment liquid remaining on the edge region of the rear surface of the substrate W may be removed. The treatment liquid removed by the contact member 620 may be discharged through the exhaust hole 780 provided on the bottom surface of the rear surface cleaning frame 700.

The substrate W, on which the rear surface cleaning step (S24) has been completed, is moved horizontally by the transfer robot 540 toward the open front surface of the rear surface cleaning frame 700 and moved vertically upward to be seated on the standby slot 740.

In the second transferring step (S26), the transfer robot 540 located in the second transfer space carries out the substrate W from the rear surface cleaning frame 700 and then transfer the substrate W to the second transfer space, wherein the substrate W stands by in the standby slot 740 after the rear surface cleaning step (S24) is completed and the treatment liquid is removed from the rear surface. The transfer robot 540 carries the substrate W transferred to the second transfer space into the drying chamber 400 and seats the substrate W on the support 430 of the drying chamber 400. The drying step (S30) is performed on the substrate W seated on the support 430 while the edge region thereof is supported.

When the substrate W is treated in the liquid treating chamber 300, the treatment liquid may be separated from the edge of the substrate W due to various factors such as process conditions, a supply amount of the liquid, and the like. The treatment liquid separated from the edge region of the substrate W may remain on the rear surface of the substrate W. The treatment liquid remaining on the rear surface of the substrate W may act as a contamination source for contaminating a subsequent substrate in a subsequent process.

Accordingly, according to an exemplary embodiment of the present invention, the treatment liquid remaining on the edge region of the rear surface of the substrate W is removed in the rear surface cleaning frame 700 having a separate inner space, thereby minimizing the contamination by the treatment liquid remaining in the chamber performing the subsequent process as well as the transfer space.

In addition, the substrate W, which has been liquid-treated in the liquid treating chamber 300, has a separate first transfer space and is transferred by the transfer robot 540 provided therein, and the substrate W of which the treatment liquid is removed from the rear surface has a separate second transfer space and may be transferred by a separate transfer robot 540 provided therein. That is, the substrate W before the treatment liquid is removed from the rear surface and the substrate W after the treatment liquid is removed from the rear surface may be transferred by a separate transfer robot 540. Accordingly, it is possible to effectively block the contamination by the treatment liquid remaining on the rear surface of the substrate W in the chamber where the subsequent process is performed.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing embodiment describes the best state for implementing the technical spirit of the present invention, and various changes required in specific application fields and uses of the present invention are possible. Accordingly, the detailed description of the invention above is not intended to limit the invention to the disclosed embodiment. Further, the accompanying claims should be construed to include other exemplary embodiments as well.

What is claimed is:

1. An apparatus for treating a substrate, comprising:
   a liquid treating chamber configured to liquid-treat the substrate by supplying a treatment liquid to the substrate;
   a drying chamber configured to dry the substrate by supplying a process fluid to the substrate;
   a transfer unit configured to transfer the substrate between the liquid treating chamber and the drying chamber; and
   a rear surface cleaning unit configured to clean a rear surface of the substrate,
   wherein the transfer unit comprises a transfer robot and a transfer hand, the transfer robot configured to move inside a transfer frame, the transfer hand configured to receive the substrate thereon, the transfer frame defining a transfer space, and
   wherein the rear surface cleaning unit is configured to move with the transfer robot and clean the rear surface of the substrate in the transfer space while transferring the substrate from the liquid treating chamber to the drying chamber.

2. The apparatus for treating the substrate of claim 1, wherein the rear surface cleaning unit includes a contact member that comes into contact with the rear surface of the substrate to remove the treatment liquid remaining on the rear surface of the substrate.

3. The apparatus for treating the substrate of claim 2, wherein the contact member is provided on the transfer robot.

4. The apparatus for treating the substrate of claim 3, wherein the contact member is located below the transfer hand and comes into contact with the rear surface of the substrate by vertical movement of the transfer hand on which the substrate is placed.

5. The apparatus for treating the substrate of claim 4, wherein a plurality of holes penetrating through upper and lower ends of the contact member are formed in the contact member, and
   the plurality of holes are spaced apart from each other along a longitudinal direction of the contact member.

6. The apparatus for treating the substrate of claim 2, wherein a rear surface cleaning frame having a slot on which the substrate is seated is provided inside the transfer frame,
   the rear surface cleaning frame is located between the liquid treating chamber and the transfer frame, and
   the contact member is provided inside the rear surface cleaning frame.

7. The apparatus for treating the substrate of claim 6, wherein the contact member is provided at a position in contact with the rear surface of the substrate in a process of transferring the substrate seated on the transfer hand into the rear surface cleaning frame.

8. The apparatus for treating the substrate of claim 1, wherein the rear surface cleaning unit comprises a non-contact member that is spaced apart from the rear surface of the substrate to remove the treatment liquid remaining on the rear surface of the substrate in a non-contact manner.

9. The apparatus for treating the substrate of claim 8, wherein the non-contact member supplies a decontamination source for removing the treatment liquid toward the rear surface of the substrate, and
   the decontamination source is provided by heat or airflow.

10. The apparatus for treating the substrate of claim 9, wherein the non-contact member is provided on the transfer robot.

11. The apparatus for treating the substrate of claim 9, wherein a rear surface cleaning frame having slots on which the substrate is seated is provided inside the transfer frame,
   the rear surface cleaning frame is located between the liquid treating chamber and the transfer frame, and
   the non-contact member is provided inside the rear surface cleaning frame.

12. The apparatus for treating the substrate of claim 1, wherein the drying chamber comprises a support for supporting the substrate, and
   the support supports an edge region of the rear surface of the substrate which has been liquid-treated.

13. An apparatus of treating a substrate comprising:

a liquid treating chamber configured to liquid-treat the substrate by supplying a treatment liquid to an upper surface of the substrate;

a drying chamber configured to dry the substrate by supplying a supercritical fluid to the substrate;

a transfer unit configured to transfer the substrate between the liquid treating chamber and the drying chamber; and a rear surface cleaning unit configured to clean a rear surface of the substrate, wherein the drying chamber comprises a housing having an inner space, and a support unit for supporting an edge region of the rear surface of the substrate which has been liquid-treated in the inner space, wherein the transfer unit comprises a transfer robot and a transfer hand, the transfer robot configured to move inside a transfer frame, the transfer hand configured to receive the substrate thereon, the transfer frame defining a transfer space, and wherein the rear surface cleaning unit is configured to move with the transfer robot and clean the treatment liquid remaining on the rear surface of the substrate by cleaning the rear surface of the substrate in a contact method and/or a non-contact method in the transfer space while the substrate is transferred from the liquid treating chamber to the drying chamber.

\* \* \* \* \*